United States Patent [19]

Wu

[11] Patent Number: 5,399,531
[45] Date of Patent: Mar. 21, 1995

[54] SINGLE SEMICONDUCTOR WAFER TRANSFER METHOD AND PLURAL PROCESSING STATION MANUFACTURING SYSTEM

[75] Inventor: H. J. Wu, Hsin-chu, Taiwan, Prov. of China

[73] Assignee: United Micrpelectronics Corporation, Hsin-Chu, Taiwan, Prov. of China

[21] Appl. No.: 628,437

[22] Filed: Dec. 17, 1990

[51] Int. Cl.⁶ ............... H01L 21/68; G06F 15/46; B65G 35/00

[52] U.S. Cl. ................ 437/205; 437/925; 29/25.01; 414/231; 414/232; 414/234; 414/235; 414/242; 414/243; 414/253; 414/262; 414/783; 414/936; 414/937; 414/938; 414/939; 414/940

[58] Field of Search ............. 414/231, 232, 234, 235, 414/242, 243, 253, 262, 783, 936, 938, 937, 939, 940; 437/925, 205; 29/25.01

[56] References Cited

U.S. PATENT DOCUMENTS

| | | | |
|---|---|---|---|
| 3,845,286 | 10/1974 | Aronstrin et al. | 235/151.1 |
| 4,492,504 | 1/1985 | Hainsworth | 414/273 |
| 4,540,326 | 9/1985 | Southworth et al. | 414/217 |
| 4,833,306 | 5/1989 | Milbrett | 414/331 |
| 4,838,150 | 6/1989 | Suzuki et al. | 55/385.2 |
| 4,846,297 | 7/1989 | Field et al. | 364/424.02 |

FOREIGN PATENT DOCUMENTS

| | | | |
|---|---|---|---|
| 0236136 | 10/1986 | Japan | 437/925 |
| 0260619 | 11/1986 | Japan | 437/925 |
| 0123735 | 6/1987 | Japan | 437/925 |
| 0229810 | 9/1988 | Japan | 437/925 |

Primary Examiner—Olik Chaudhuri
Assistant Examiner—David E. Graybill
Attorney, Agent, or Firm—George O. Saile

[57] ABSTRACT

A manufacturing system and method for processing semiconductor wafers through a plurality of processing stations that perform manufacturing operations on wafers includes a plurality of processing stations, each of which are capable of performing at least one processing operation on a wafer, each of the processing stations having a controlled environment for processing the wafers, and a branched tunnel joined and communicating with the controlled environment. A means is provided for maintaining a clean environment in the tunnel. Within the tunnel there are provided a plurality of guided transport vehicles adapted to travel between the process stations. A plurality of wafer carriers, each adapted to support a single wafer and be carried by the transport vehicles, are part of the system.

35 Claims, 18 Drawing Sheets

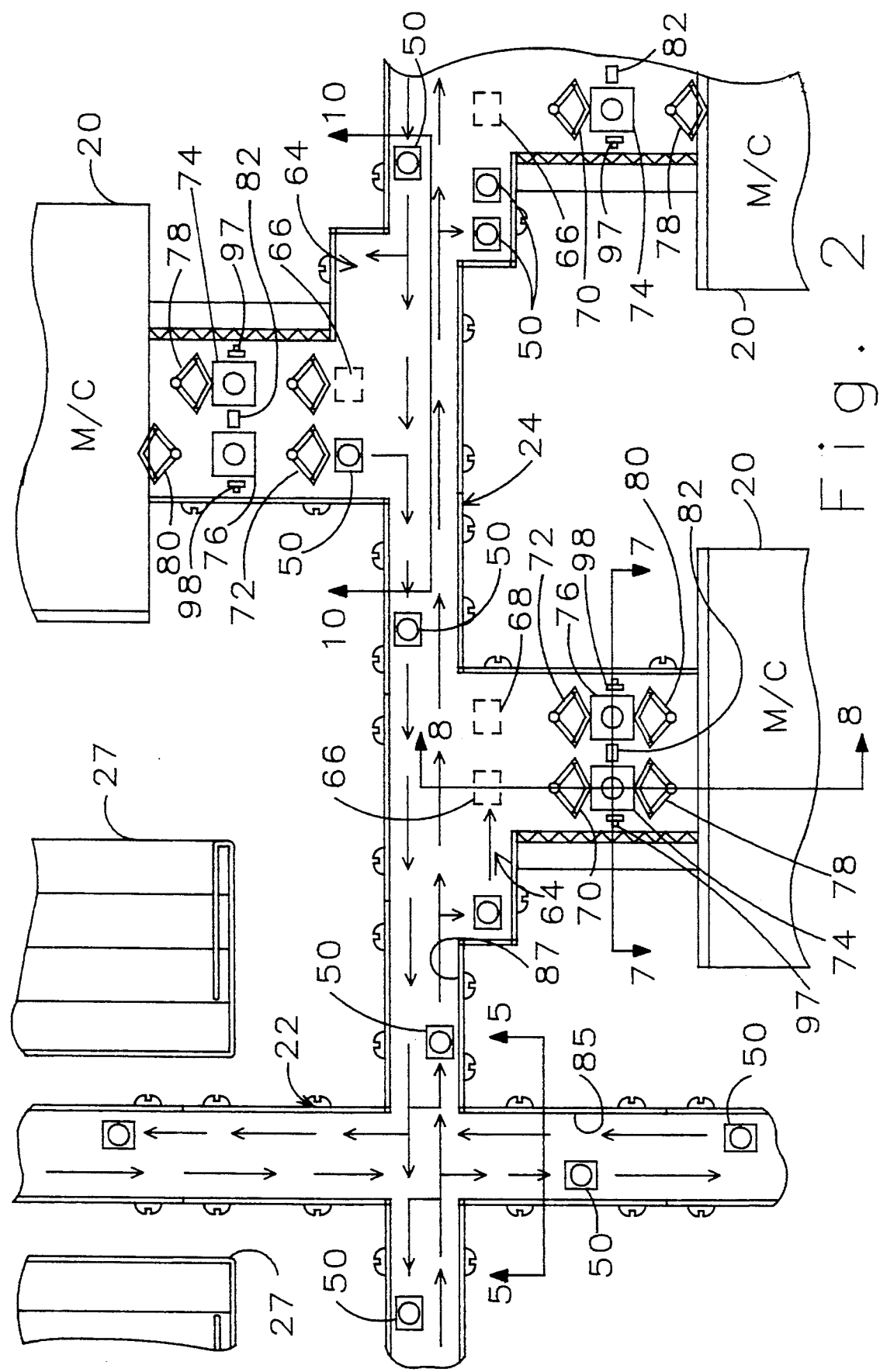

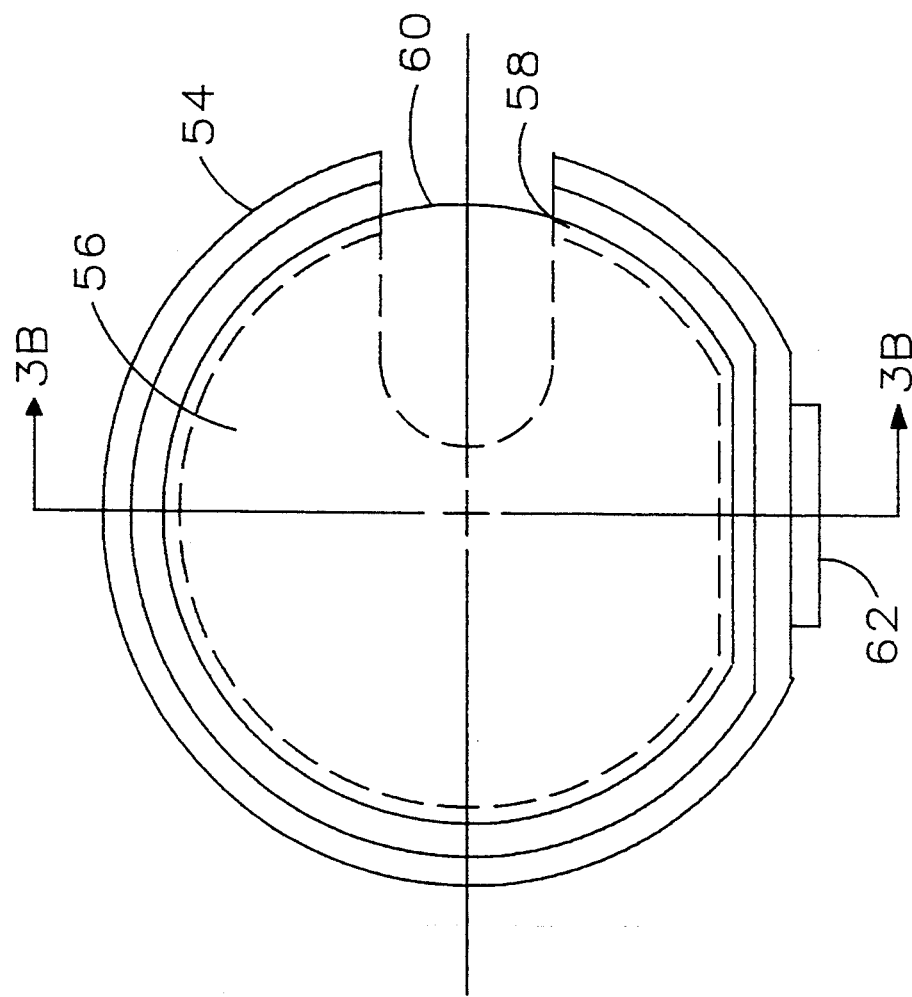
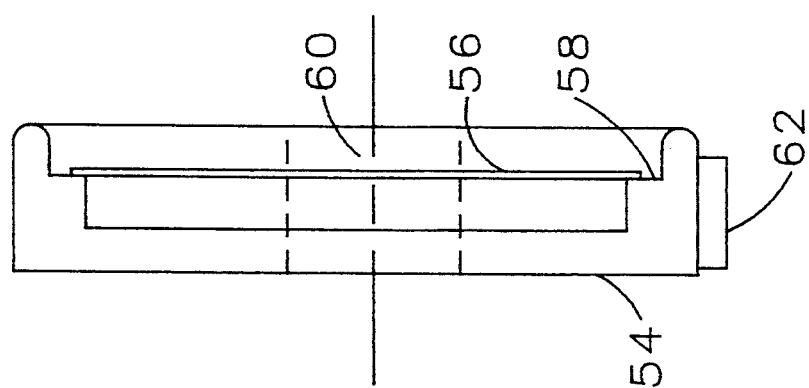

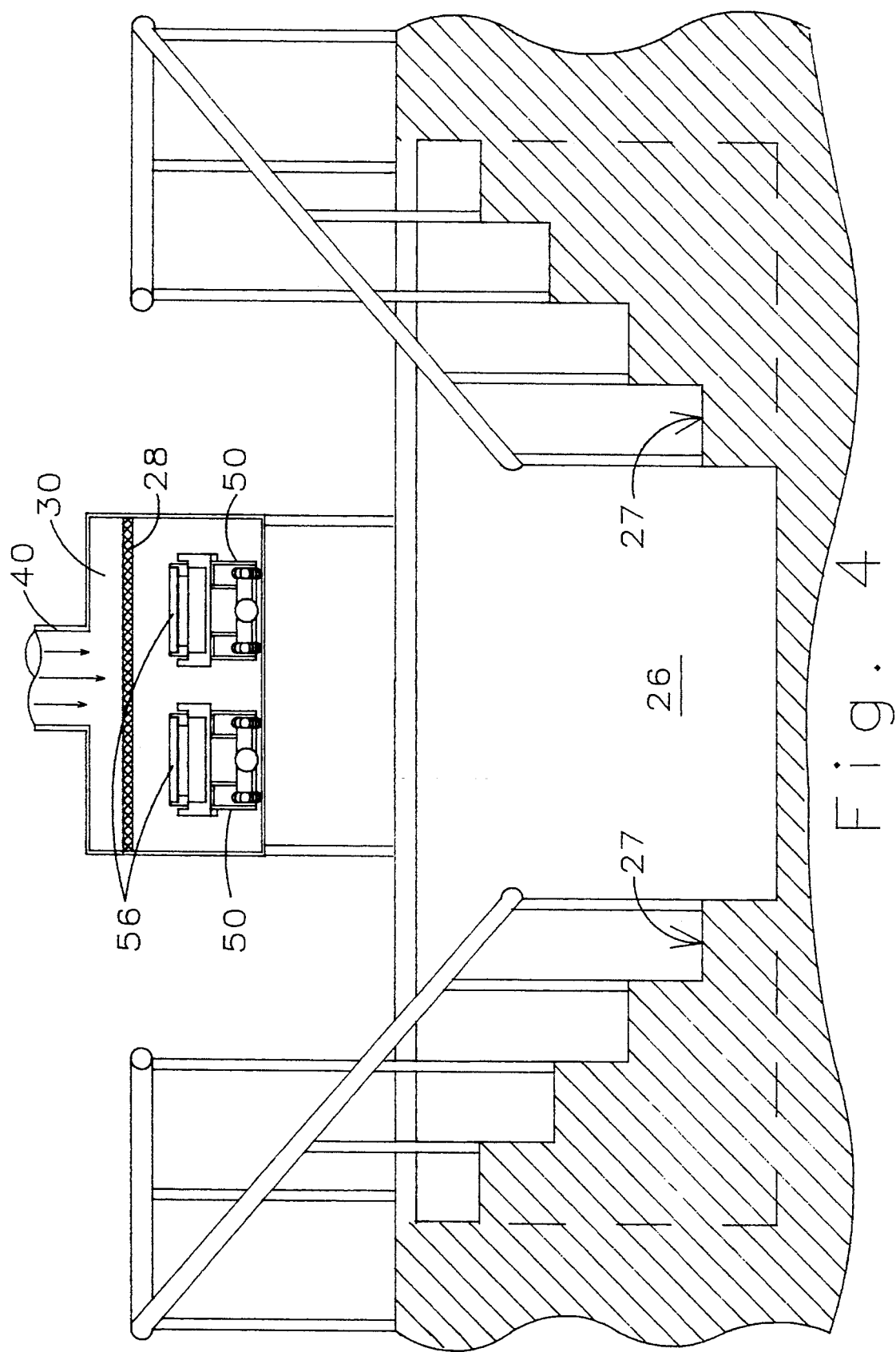

SINGLE SEMICONDUCTOR WAFER TRANSFER METHOD AND PLURAL PROCESSING STATION MANUFACTURING SYSTEM

BACKGROUND OF THE INVENTION (1) Field of the Invention

The present invention relates in general to automated manufacturing of integrated circuit semiconductor devices, and more particularly to a system where each wafer is handled as a single unit, as contrasted to the more conventional batch processing. This single unit handling method and system can result in faster cycle time, better prevention of particulate contamination and easier mechanisms.

(2) Description of the Prior Art

In the manufacture of semiconductor devices, a circular monocrystalline semiconductor wafer, most typically of monocrystalline silicon, is subjected to a large number of processes steps. These process steps include oxidation of the surface to form silicon dioxide insulating layers, deposition of polycrystalline silicon and/or metallic layers, diffusion and/or ion implantation of dopants into selected areas, lithography/masking/etching operations, etching of the various layers mentioned above, heat treating and other steps that are well known to those skilled in the art. A multitude of extremely small and complex electrical circuits are thus formed on the semiconductor wafer through these process steps. As the technology has progressed, the wafers have been made larger and the feature size of the elements of the circuitry on the wafer's surface have been greatly decreased. This progress has also lead to increasingly faster circuits manufacturable on the wafer.

As the size of the circuitry has decreased, airborne contamination becomes responsible for a serious yield problem. Since the integrated circuitry formed upon the silicon wafer is extremely small with feature size in the order of near micrometer or even submicrometer, it only takes a very small sized particle to either short circuit or cause an open in the formed circuitry. Also, such a particle can block processing chemicals from reaching every portion of the circuitry on the wafer during critical processing steps. Some contamination particles can cause incomplete etching in spaces between lines, thus leading to an unwanted electrical bridge. In addition to such physical defects, other contamination particles may cause electrical failure due to induced ionization or trapping centers in gate dielectrics or the like.

The main sources of particulate contamination are manufacturing line workers, equipment, and chemicals. Particles given off by workers in the area are transmitted through the environment, and through physical contact or migration onto the wafer surfaces. People, by shedding of skin flakes, for example are a significant source of particles that are easily ionized and cause defects. It has been found that as many as 6000 particles per minute are emitted into and adjacent a cubic foot of space by a fully suited operator.

An early effort to overcome the contamination problem was to process semiconductor devices in clean rooms with HEPA or ULPA recirculating air systems with suited operators. This procedure is, however quite expensive and not always effective particularly in the era of submicrometer feature size that we are now entering. Although clean room garments reduce particle emissions they do not fully contain the emissions. Also, it is inconvenient and uncomfortable to the operators to remain fully suited at their work throughout the entire work shift.

Movement of semiconductor wafers through the fabrication system for integrated semiconductor devices have long used a cassette system to handle wafers. The wafers are carried in cassettes from processing machine to processing machine. There are many wafers in each cassette. Typical wafer cassettes are manufactured and sold by Fluoroware, Inc. of North Chaska, Minn. U.S.A.

The disadvantages of the cassette system are that the wafers are batch processed, since the cassette is designed to hold many wafers. The cycle time for each wafers then becomes long. This adds to the cost, since a greater inventory is tied up for a longer time. Also, the response time to meet varying customer requirements is long. In addition, the friction between the wafer and the cassette can create particles when the wafers are loaded and unloaded. This contamination occurs in the clean environment and remains there. Still further, the batch transportation of wafers in a cassette or carrier opens the entire batch of wafers to damage from shock loads.

A more recent innovation in cassette systems useful in reducing the effects of contamination is the Standard Mechanical Interface (SMIF) system which is based on the realization that a small volume of still particulate-free air, with no internal source of particles is the cleanest possible environment for silicon wafer processing. A SMIF has been proposed by the Hewlett-Packard Company and is described in U.S. Pat. Nos. 4,532,970 and 4,534,389. The SMIF system consists of two parts, that is (1) a controlled environment including a clean process environment canopy surrounding a wafer-handling mechanism of each processing machine, and (2) a small clean box having a quiet internal environment for carrying a number of wafers from processing machine to another processing machine. Basically, the clean environment is maintained in the process station and in the box or cassette for carrying wafers. The wafers, contained in the cassette are introduced into the clean environment surrounding the machine through an air lock, processed in the processing machine, placed back in the cassette, and withdrawn through another air lock. The wafers are then moved to another processing machine for the next process by the same procedure.

The problems inherent in the SMIF system is first those that were described about for the cassette system, since SMIF is a cassette system. The further problems involve the mechanization difficulties in moving the wafers from the SMIF cassette pod to the processing machines.

The U.S. Pat. No. 4,540,326 discloses a system for transporting wafers between processing stations through a tunnel where a clean environment is maintained. However, the wafers are loaded and unloaded into a cassette mounted on a cart. The system, however is a batch operation with the aforedescribed disadvantages. Further, the system is inflexible, that is not capable of simultaneously processing wafers requiring different types of processing. Complete fabrication of single wafer transfer using prior art will be very rigid and loses all flexibility.

The U.S. Pat. No. 3,845,286 describes a wafer processing system wherein single wafers are transported to various processing stations with a transport mechanism. While the concept of individual wafer processing is disclosed, the problems concerning contamination are not addressed. These problems would be substantial in the environment described in this processing system.

The U.S. Pat. No. 4,027,246 also discloses a wafer processing system where semiconductor wafers are individually transported between processing stations. The wafers are transported between processing stations by use of an air track, which in modern manufacturing technology would be unacceptable, because of a lack of adequate contamination prevention control.

SUMMARY OF THE INVENTION

It is a primary object of the present invention to provide a single wafer transfer system and method using a very flexible vehicle single wafer transfer between single wafer processing stations.

It is a further object of this invention to provide a system and method for transferring single wafers through each of their fabrication sequences to result in faster cycle time, better prevention of particulate contamination and easier mechanical movement between processing machines.

It is a still further object of the present invention to provide an improved semiconductor wafer processing system that controls contamination in the working environment.

Yet another object of the present invention is to provide a semiconductor wafer processing system which is less abrasive to the wafers during processing, thereby reducing contamination from abraded particles and also reducing the potential damage to the wafers due to shock and vibration.

The manufacturing system of the invention for processing semiconductor wafers through a plurality of processing stations that perform manufacturing operations on wafers includes a plurality of processing stations, each of which is capable of performing at least one processing operation on a wafer, each of the processing stations having a controlled environment for processing the wafers, and a branched tunnel joined and communicating with the controlled environment for processing the wafers at the processing stations. A means is provided for maintaining a clean environment in the tunnel. Within the tunnel there are provided a plurality of guided transport vehicles adapted to travel between the process stations. A plurality of wafer carriers, each adapted to support a single wafer and be carried by the transport vehicles, are part of the system of the invention.

At each of the processing stations there is provided a transport vehicle buffer having an unload zone and a load zone, a wafer carrier buffer, a wafer carrier handling unit adapted to transfer wafer carriers between a transport vehicle buffer and the wafer carrier buffer and a wafer processing apparatus. An information storage memory is provided on each of the wafer carriers which is capable of holding the wafer process sequence of the wafer supported on the carrier. A computer or microprocessor is located on each vehicle for directing the vehicles to move wafer carriers to each processing station in accordance with the wafer process sequence stored in the storage memory on the wafer carrier. A wafer will remain with the same wafer carrier throughout its processing, although the wafer will be lifted from the carrier for processing at the processing stations. A vehicle station is provided wherein wafers and wafer carriers are introduced into the system for processing and removed from the system upon completion of processing.

In the method of the invention of manufacturing semiconductor devices on a production line having (a) a plurality of semiconductor wafer processing stations, (b) a tunnel structure communicating with the processing stations, (c) a guided transport vehicle adapted to operate in the tunnel between processing stations, (d) a plurality of wafer carriers, each provided with an information storage memory to accept a wafer process step sequence, (e) means to maintain a clean environment in the tunnel, (f) handlers at each processing station for transferring wafer carriers and wafers between a transport vehicle and the processing station, and (g) a computer system to guide the transport vehicles in the tunnel, load wafers and carriers at the processing stations, in response to information in the wafer carrier memory, the method includes the steps of (1) loading a process sequence into the wafer carrier memory, and a wafer onto the wafer carrier, (2) loading the wafer carrier onto a transport vehicle, (3) moving the transport vehicle to a processing station in response to information contained in the process sequence stored in the wafer carrier memory, (4) unloading the wafer carrier at the designated processing station, (5) performing the indicated process on the wafer at the processing station, (6) altering the process sequence to indicate that the process step has been completed, (7) loading the wafer and wafer carrier onto a transport vehicle, (8) moving the transport vehicle to the next processing station in response to the altered process sequence, and (9) repeating the foregoing method steps until the process sequence in the wafer carrier memory is complete.

Additional objects and features of the invention will appear from the following description in which the preferred embodiments of the invention have been set forth in detail in conjunction with the drawings.

BRIEF DESCRIPTION OF THE DRAWINGS

The drawings show the following.

FIG. 2 is a diagrammatic representation in plan view, in greater detail and in larger scale, of a portion of the manufacturing system of the invention.

FIG. 3A is a top plan view of a preferred embodiment of a wafer carrier for use in the manufacturing system of the invention.

FIG. 3B is an elevational view taken on line 3B—3B of FIG. 3A.

FIG. 4 is an elevational view taken on line 4—4 of FIG. 1B illustrating a pass-through tunnel access arrangement.

DESCRIPTION OF THE PREFERRED EMBODIMENTS

Figure 1A:
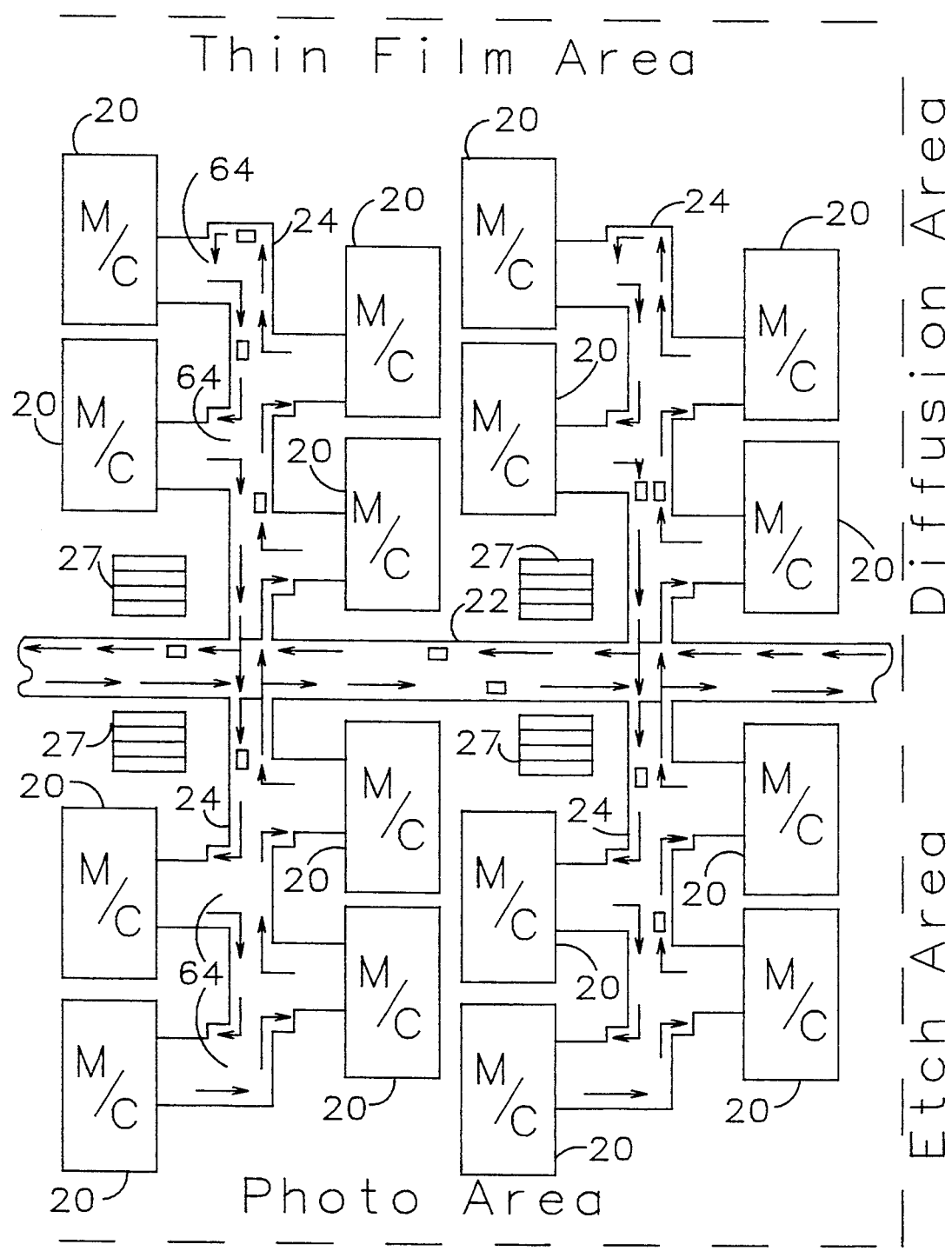
FIGS. 1A and 1B are diagrammatic representations in plan view of a manufacturing system embodying the principles of the invention of this application. These two Figs. should be viewed together as adjacent parts of the Single Semiconductor Wafer Transfer System of the present invention.
Figure 1B:
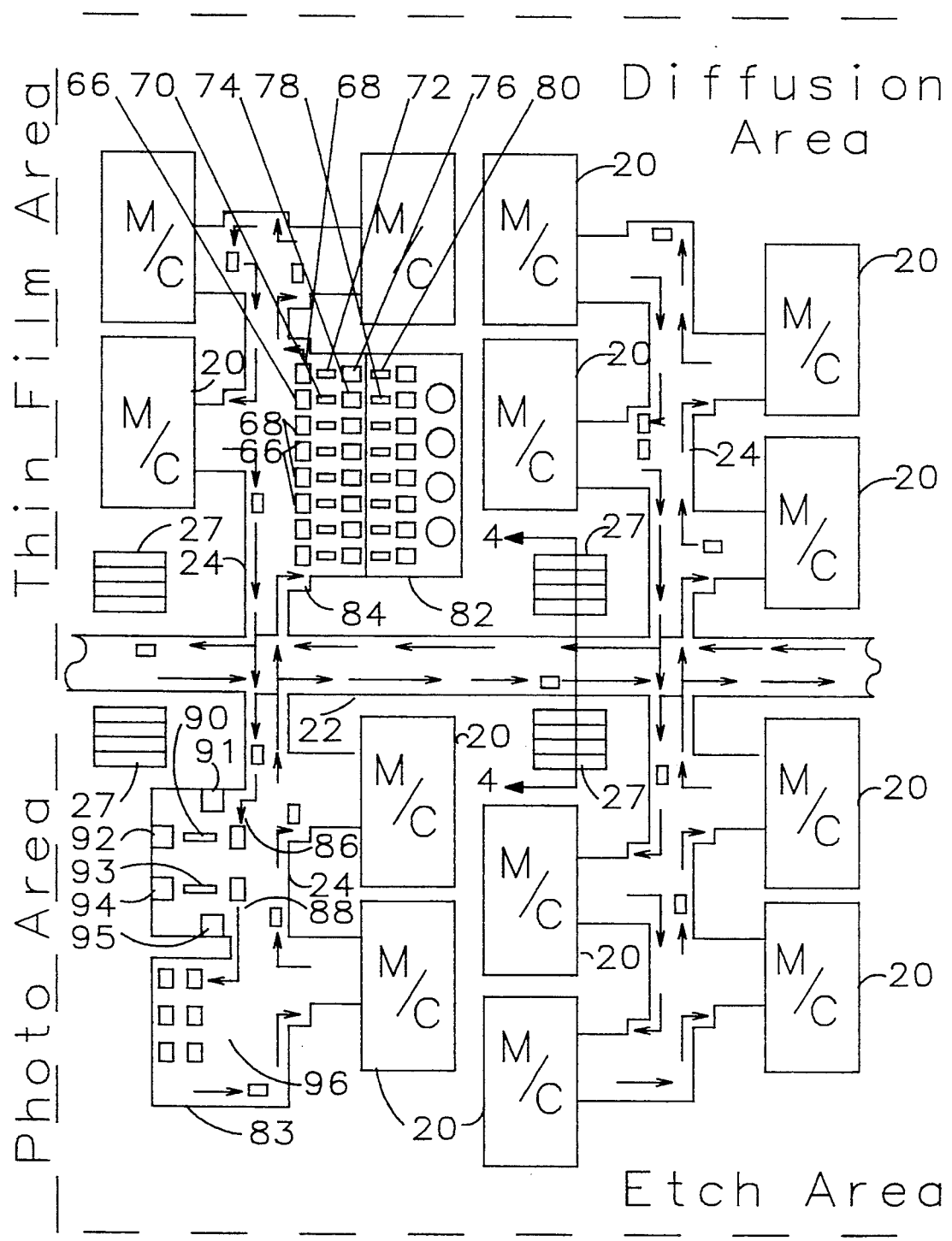

Referring now to the Figures of the drawing, and to FIG. 1A and 1B in particular there is illustrated a diagrammatic plan view of the manufacturing system of the invention. The system has a series of processing stations 20 for performing the various manufacturing operations on semiconductor wafers. The fabrication of typical semiconductor integrated circuits today may include a process sequence of 200 or more process steps using 50 or more workstations and hundreds of pieces of equipment. The work stations 20 could include the following machine types: lithography masking, silicon oxide furnace, diffusion furnace, ion implanter, wet etcher, dry etcher, epitaxy, chemical vapor deposition, sputter deposition, prober, inspection machines, rapid thermal anneal and the like, all of which are known to the prior art.

The organization of these processing or work stations 20 groups them in four major Areas, that is the Thin Film Area, the Photo or Lithography Area, Diffusion and Ion Implant Area, and the Etch Area. The purpose of this grouping is convenience for operation, observation and maintenance. The manufacturing operations do not need manual handling or push buttons, but need constant observation for the development of special situations and maintenance. People assigned for these jobs are divided into four groups by the mentioned specialties. Therefore, each group of operations is better confined in closer locations for the convenience of the assigned people. Each of the processing station 20 has its own specially a controlled environment for processing wafers within its structure.

A tunnel 22 with branches 24 is connected to the processing stations 20 and provides a passage between the stations. Preferably an access tunnel 26 is provided beneath tunnel 22 for servicing, as indicated in FIG. 4. Access to tunnel 26 is by stairways 27.

Figure 5:
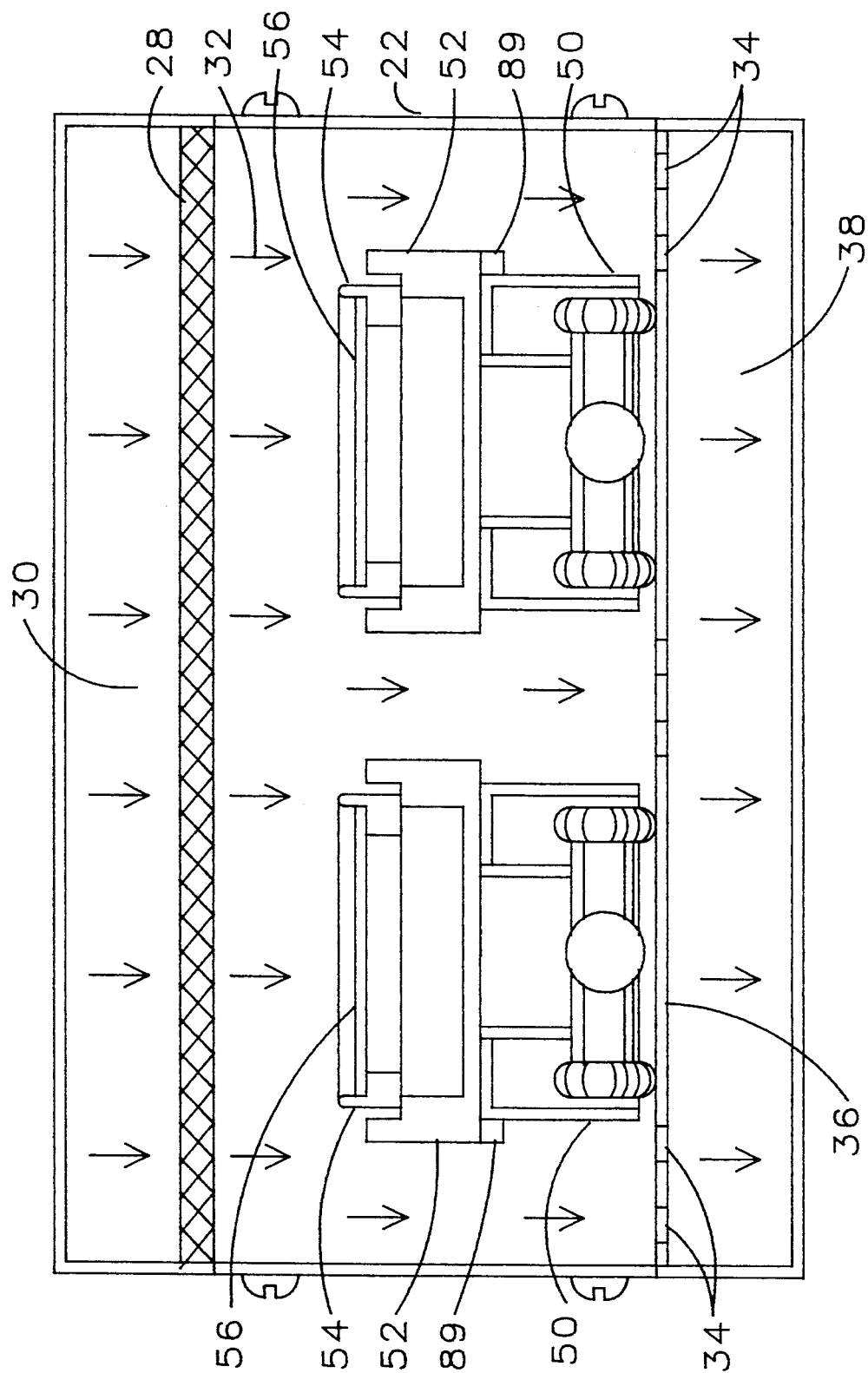
FIG. 5 is a detailed elevational view of a cross section of the tunnel taken on line 5—5 of FIG. 2.

A clean environment is maintained in the tunnel 22 and tunnel branches 24 with a constant laminar flow of air. As shown in FIG. 5, air or other suitable gases or gas mixtures thereof are forced through a filter 28 from a duct 30 located in the top of the tunnel 22 and branched tunnels 24. The air flow, as indicated by arrow 32 flows laminarly from the top to the bottom of the tunnel and through holes 34 in floor 36.

The air is exhausted through exhaust duct 38 located in floor 36. The filter 28 is a laminar flow ULPA filter capable of removing 0.05 micron particulates to 99.9995%. This removal of particles brings the tunnel to the highest possible clean room class. The U.S. Federal Standard No. 209d maintains the definition of the Classes from Class 100,000 down to Class 1. The most desired clean room today is Class 10 or even Class 1 if that could be attainable. The tunnel is preferably Class 1 with less than 0.1 micron particle size in the tunnel. Filters that are capable of such operation are made by Air Tech Japan, LTD. of Tokyo 110, Japan; Flanders Filter, Inc. of Washington, N.C., U.S.A and Cambridge Filter Corporation of New York, N.Y., U.S.A.

The circulating gaseous media in the tunnel can be air as in conventional clean room environments as described. Alternatively, nitrogen can be used. With a gas tightened environment, nitrogen can be circulated, temperature adjusted and filtered, just as air, to play the role of an environment. The advantages of nitrogen have been described by researchers who have observed that a nitrogen environment can prevent growth of native silicon oxide or other from of gaseous or molecular contamination which can not be prevented by a ULPA filter. These native oxide and molecular contaminations are more crucial for submicron semiconductor processing. Special doors may be used to prevent loss of nitrogen at certain of the processing stations. Also, a monitor system can be used to monitor the tunnel ambient so as to check the buildup of moisture, loss of nitrogen, etc..

Figure 10:
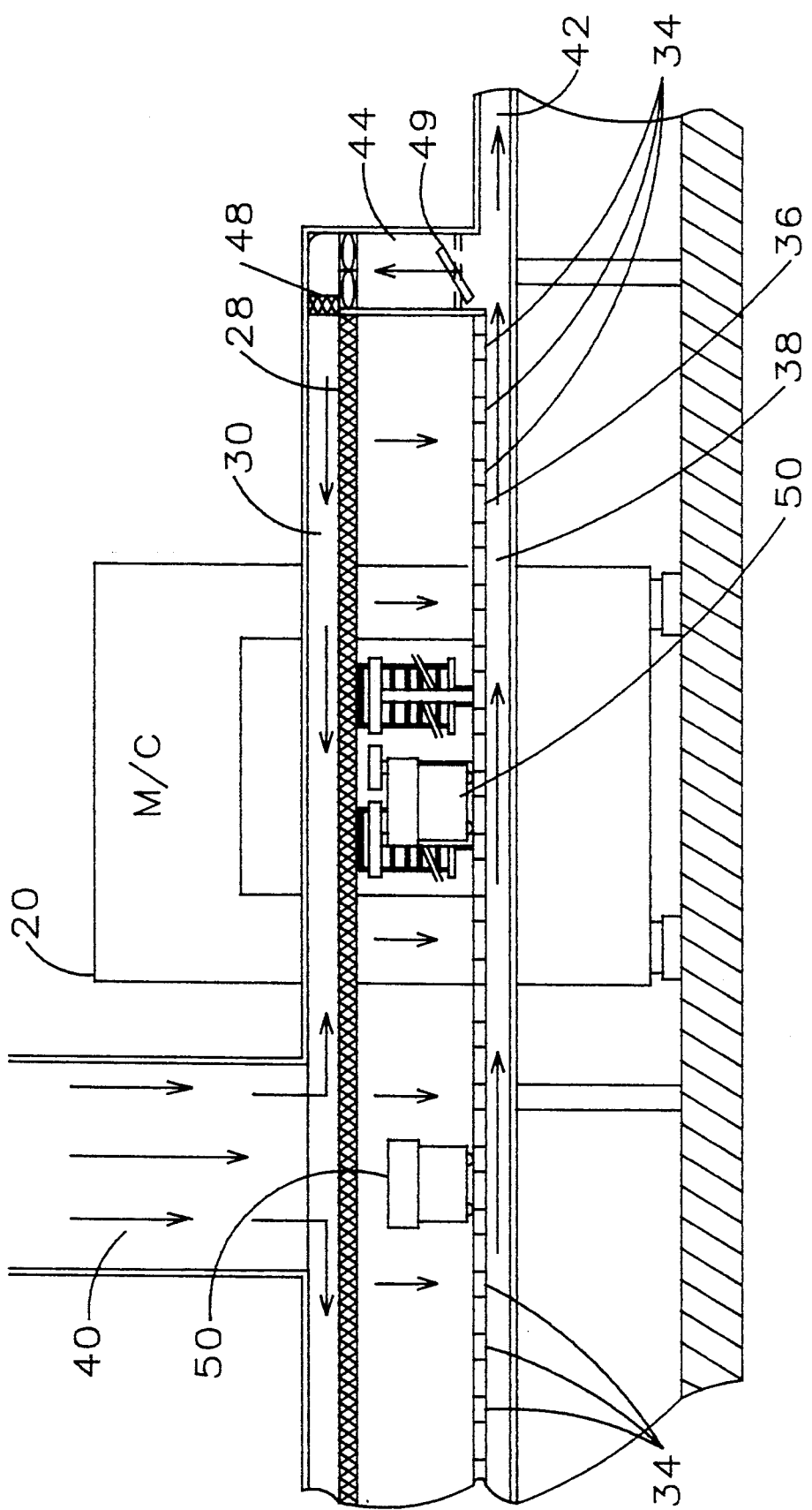
FIG. 10 is a view taken on line 10—10 of FIG. 2 and shows the tunnel system with vehicles, cleaning air system, and load and unload systems.
Figure 11A:
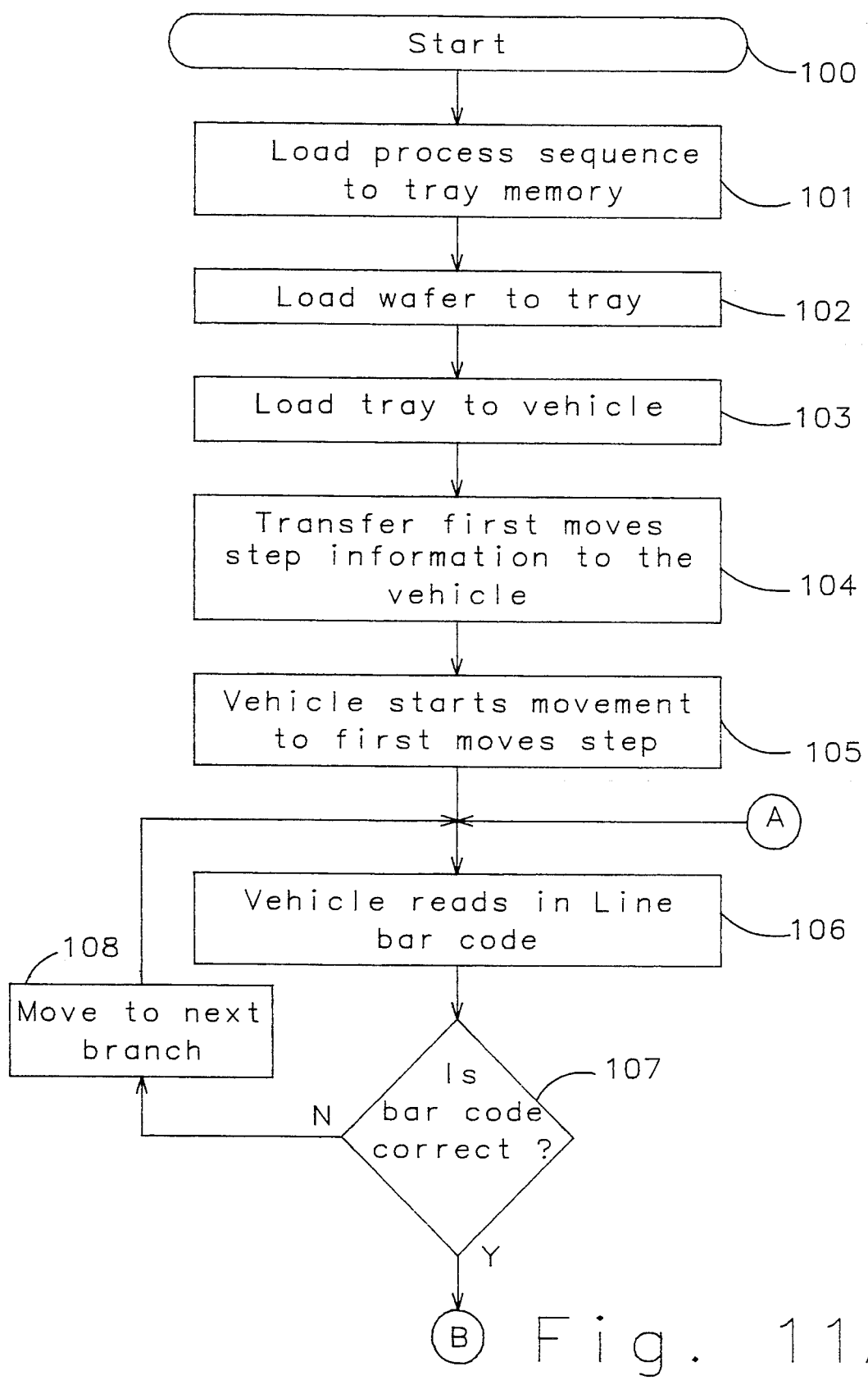
FIG. 11A through 11F is a operational flow diagram of the manufacturing system of the invention.
Figure 11B:
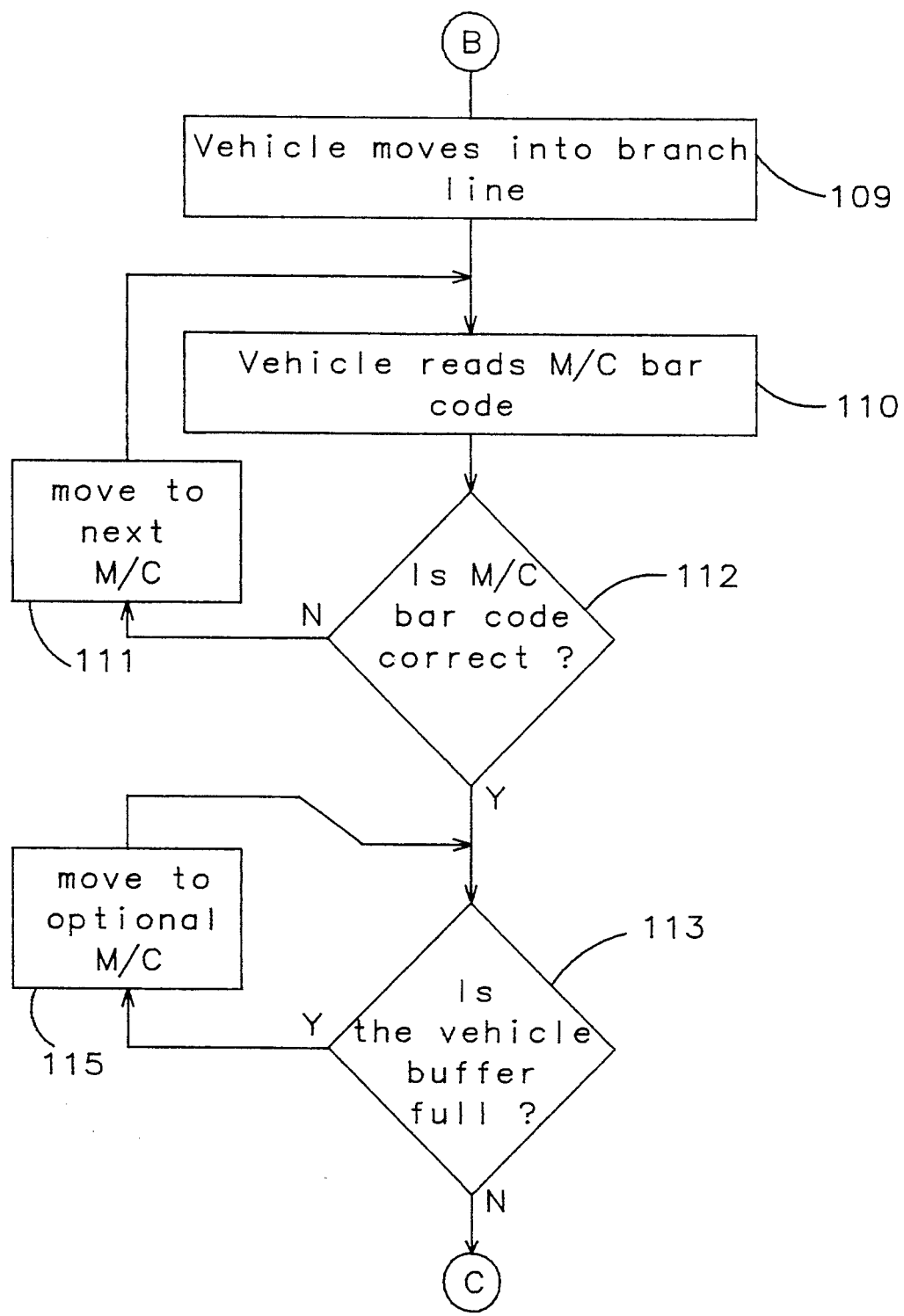
Figure 11C:
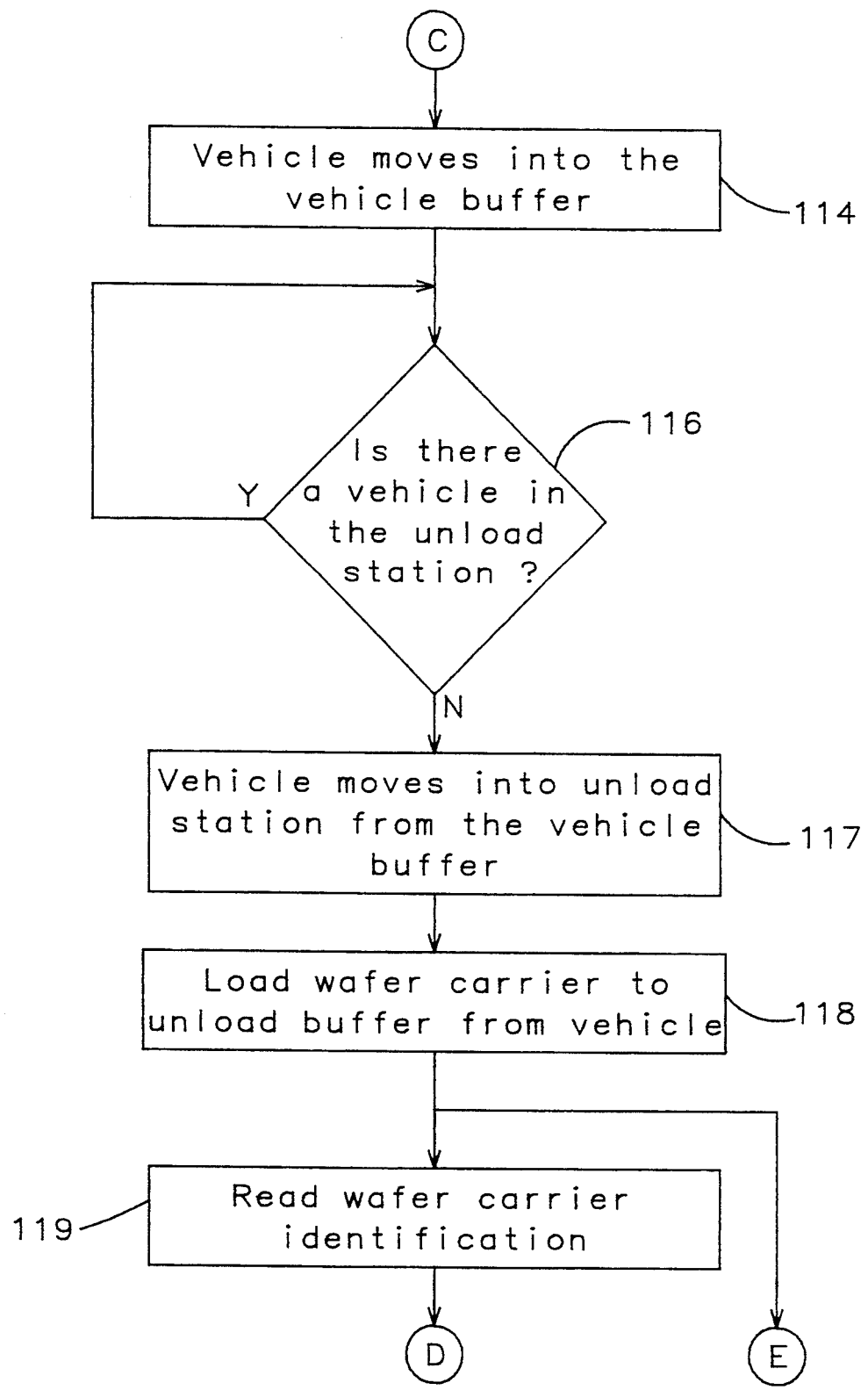
Figure 11D:
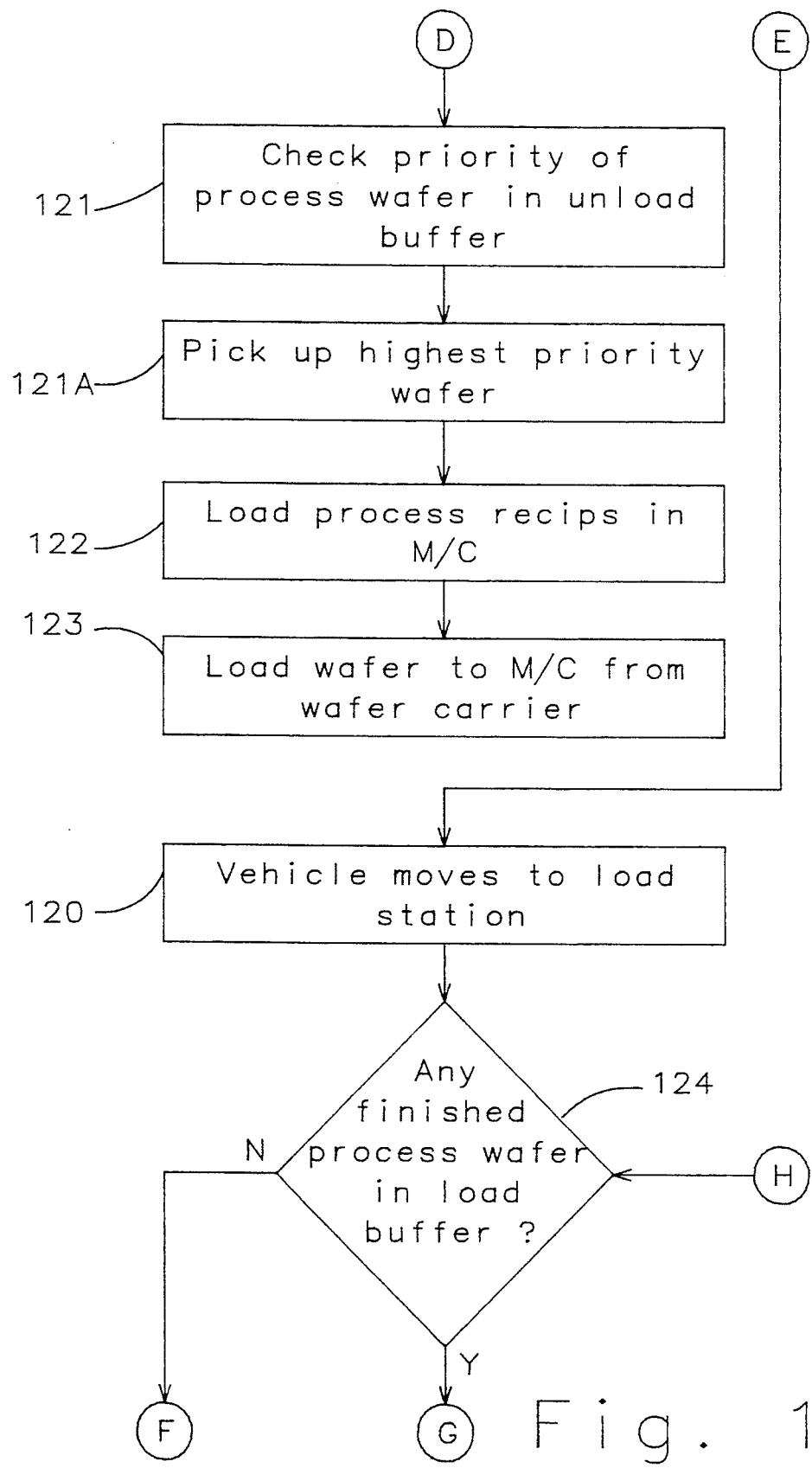
Figure 11E:
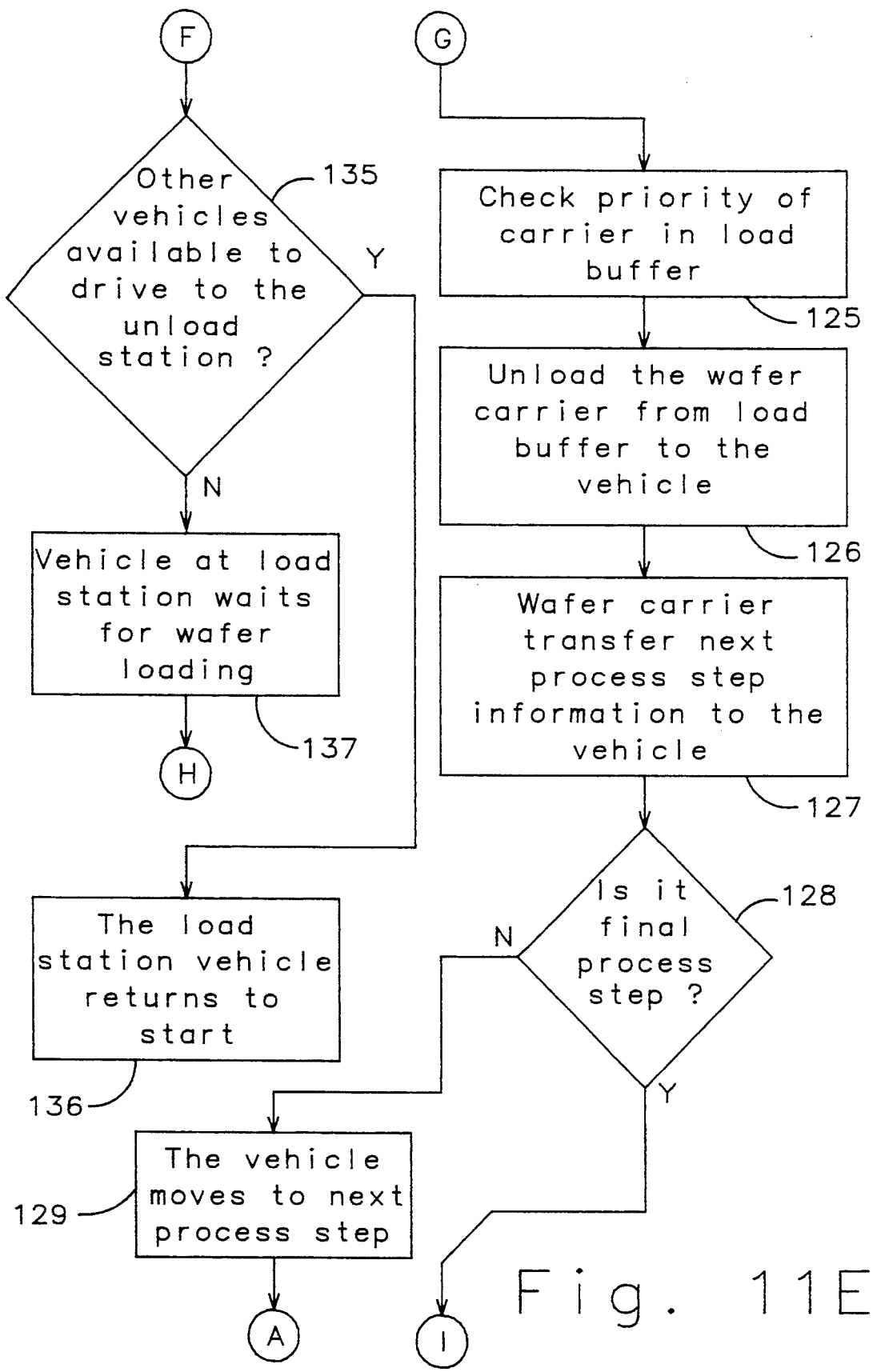
Figure 11F:
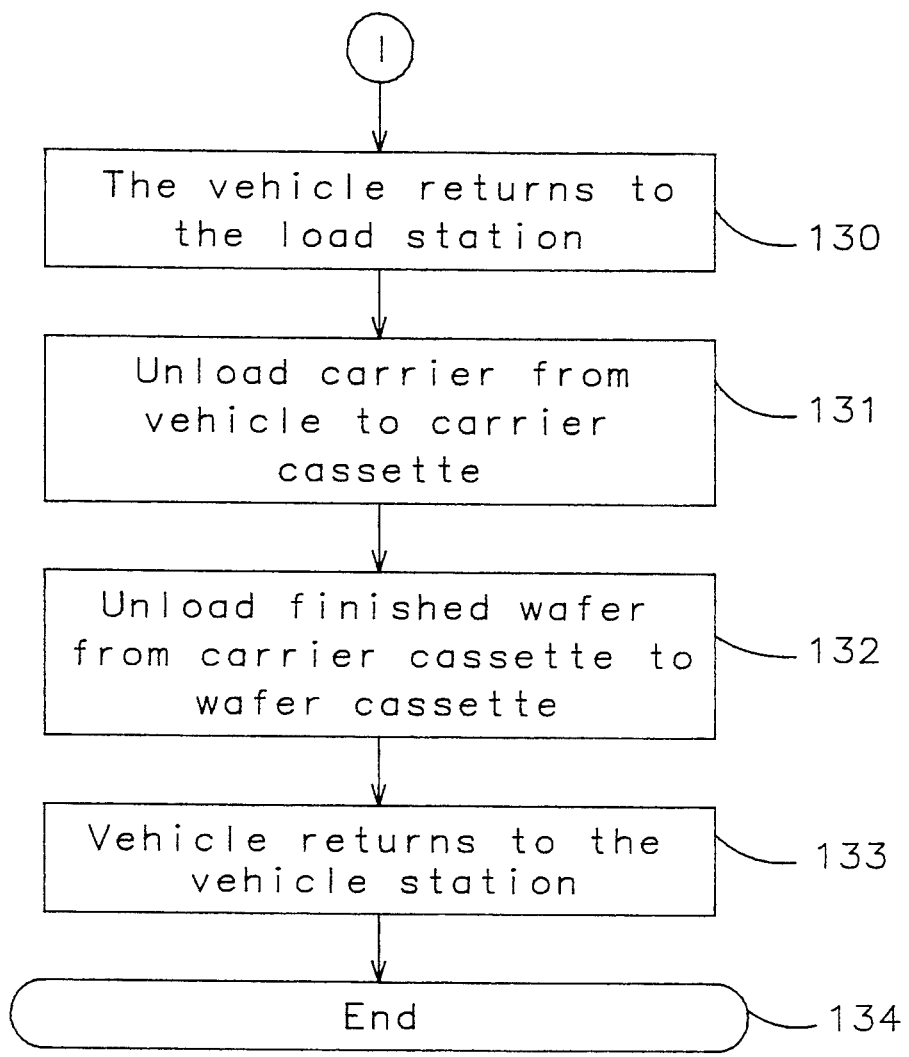

The overall system for maintaining a clean air environment is illustrated in FIG. 10 which shows an air supply duct 40 that supplies air to upper duct 30. The air in lower duct 38 is returned to a blower or air conditioner through duct 42. A portion of the air from lower duct 38 can be recirculated by passage 44. The recirculated air is forced through duct 44 by blower 46 through a pre-filter 48. The recirculation is controlled by damper 49. The air in the tunnel is maintained at room temperature and normal atmospheric pressure. This would be the same conditions should nitrogen be used.

The clean air environment can be maintained in the controlled environment portion of each of the processing stations 20 as is required to accomplish the desired results in that particular processing station.

Transport vehicles 50 are provided within the tunnel 20 and branch tunnels 22. The tunnels are wide enough to accommodate two way traffic of vehicles 50. The vehicles 50 are preferably guided through the tunnels by a guide tape on the floor of the tunnels. Vehicles 50 have a suitable source of power to move independently of each other.

The vehicles 50 as shown in FIG. 5, have a platform 52 to support a wafer carrier 54. The vehicles 50 each have a steering mechanism which allows them to traverse the tunnel and branch tunnels while maintain an orderly flow of traffic. Other construction features of these vehicles may include an appropriate local power source such as a battery, motor and driving mechanism, microprocessor with memory, bar code reader, computer interface of optical or radio techniques.

The wafer carrier 54 is most clearly illustrated in FIG. 3A and FIG. 3B. The wafer carrier 54 is adapted to support a semiconductor wafer 56 on a narrow ledge 58. The ledge 58 is made as narrow as possible in order to minimize the contact with wafer 56. Minimal contact reduces the probability of abrading material from the wafer which would become a source of contamination. A recess 60 is provided in wafer carrier 54 to allow a wafer handler apparatus to pick up a wafer supported on the carrier. The wafer carrier has an information storage unit 62 that is capable of holding the entire process sequence of a wafer to be processed. This storage unit 62 may be a microprocessor or microcomputer having sufficient memory capacity. Besides keeping the identity and process sequence for the wafer, the carrier also keeps the wafer from direct contact with the vehicle or other substances which are not so easy to be cleaned as is the carrier 54.

As seen in FIG. 2, at each processing station 20 there is provided a transport vehicle buffer 64 having an unload zone 66, where a vehicle 50 can be parked, off the main tunnel route, and the wafer carrier can be unloaded for processing at the associated processing station. Buffer 64 also has a load zone 68 where a vehicle 50 can be parked to receive a wafer carrier from a processing station 20 after the process step on the wafer has been completed. The vehicles 50 can be guided from the tunnel into and out of the buffer zone, as will be explained later.

Figure 6:
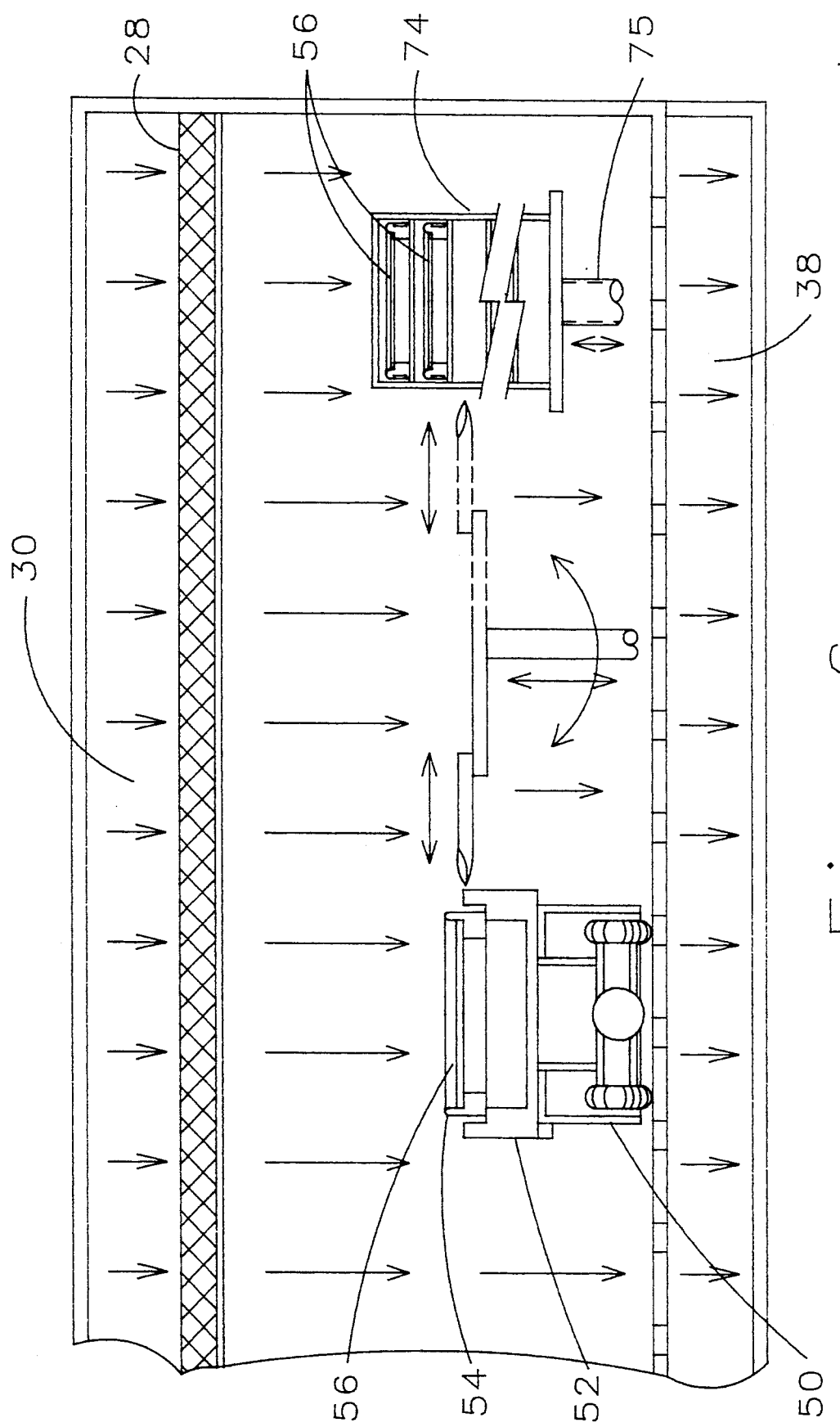
FIG. 6 is an elevational view of the apparatus used to load wafer carriers on transport vehicles in preparation for processing.

As shown more clearly in FIG. 2, a wafer carrier handling apparatus 70 is provided to take a wafer carrier from a transport vehicle parked at the unload zone 66, and to place it in wafer carrier buffer 74. A wafer carrier handling apparatus 72 is provided to take a wafer carrier from wafer carrier buffer 76 and to place it on a transport vehicle parked at the load zone 68. Wafer carrier buffers 74 and 76 are preferably adapted to hold a plurality of wafer carriers. A suitable structure is shown in FIG. 6 wherein a plurality of shelves can be moved vertically by a vertically movable shaft 75. A wafer handling apparatus 78 is provided to remove a wafer from a wafer carrier, stored at wafer carrier buffer 74, and place it in position for processing at the associated processing station 20.

A wafer handling apparatus 80 is provided to receive a processed wafer from the processing station 20 and return it to its wafer carrier in wafer carrier buffer 76. While the wafer is processed in the processing station, its empty wafer carrier is transferred from buffer 74 to buffer 76 by a suitable transfer mechanism 82. Any suitable handling means can be provided for transferring wafers and wafer carriers between the transport vehicle and processing station 20.

While it is contemplated that near 100% of processing stations will perform operations on single wafers, there are some operations that are better suited to batch operations at least at today's level of technology. These operations are those that consume very long times. These operations would require many duplicate single wafer machines to replace the batch machine. In a typical 1M SRAM process using 0.8 micron line width, double poly silicon, double metal interconnection and a total of 17 mask steps there might be 12 steps at the present time that would still be batch operations. These are silicon nitride deposition I, well drive-in after P well ion implantation, silicon nitride deposition II, field oxidation(LOCOS), poly silicon deposition I, poly silicon deposition II, poly silicon doped by $POCl_3$, N+ source/drain ion implant(high current), P+ source/drain ion implant(high current), poly silicon deposition II-2, poly silicon deposition II-2 ion implant, and plug implant contact plug to source/drain. It is believed that the first of this group to be replaced with single wafer processing would be the four ion implantation steps. Next, would be the chemical vapor depositions. Then the phosphorous diffusion step will be replaced with single wafer ion implantation. Then, the well drive-in will be replaced with direct implantation and rapid thermal processing. Finally, the LOCOS will be replaced with single wafer trench isolation by reactive ion etching and chemical vapor deposition.

The manufacturing system of the invention can accommodate batch operations in combination with single wafer processing. As shown in FIG. 16, there is illustrated a processing station 82, which performs a batch operation. A modified vehicle buffer station 84 is provided which has multiple unload and load zones. Each load and unload zone is provided with a wafer carrier buffer and its associate wafer carrier and wafer handling apparatus. Typically, the location of the unload and load zones will be alternated so that the wafers can be returned to their respective wafer carrier upon completion of the process operation.

The manufacturing system requires a system for directing and controlling the movement of the transport vehicles 50 within the tunnel 22 and the branches 24 of the tunnel. In operation, the vehicle 50 will deliver wafer carriers, and a semiconductor wafer to the various processing stations, in the order called for by the process sequence stored in the information storage 62 on wafer carrier 54. When all of the process steps are completed, the vehicle will deliver the wafer carrier and wafer to vehicle station 85 where the wafer carrier and wafer are unloaded.

Suitable indications, that are readable by an interface on the vehicle, are provided on the tunnel surface, such as a wall adjacent each tunnel branch, and also adjacent each process machine. A preferred indicator is a bar code marking 85, as is well known in the art. This is placed ahead of each branch. An additional bar code marking 87 is located ahead of each process station. Marking 85 would indicate the various process stations on each tunnel branch, and marking 87 would indicate the specific process station. A suitable interface 89 is provided on the vehicle to read the various markings.

The vehicle is also provided with another interface to read the process sequence stored in the information storage 62 on carrier 54. when a wafer carrier is received by the vehicle 50 at a load station 68, the information in the information storage 62 is transferred to a computer, such as a microprocessor on the vehicle, or a central computer in communication with the vehicle. This information will include the next required process step. The vehicle will the leave the unload station and proceed into the tunnel branch and to the tunnel. When the vehicle passes a branch that has the required process station, as indicated by the bar code 85, it will be directed into the branch, that is the vehicle will turn off the guide tape on the floor of the tunnel and follow the guide tape on the floor of the tunnel branch. When the proper process station 20 is approached, as indicated by bar code 87, the vehicle will turn off the guide tape on the branch floor and follow the guide tape leading to the vehicle buffer station 64 and unload station 66.

Figure 9:
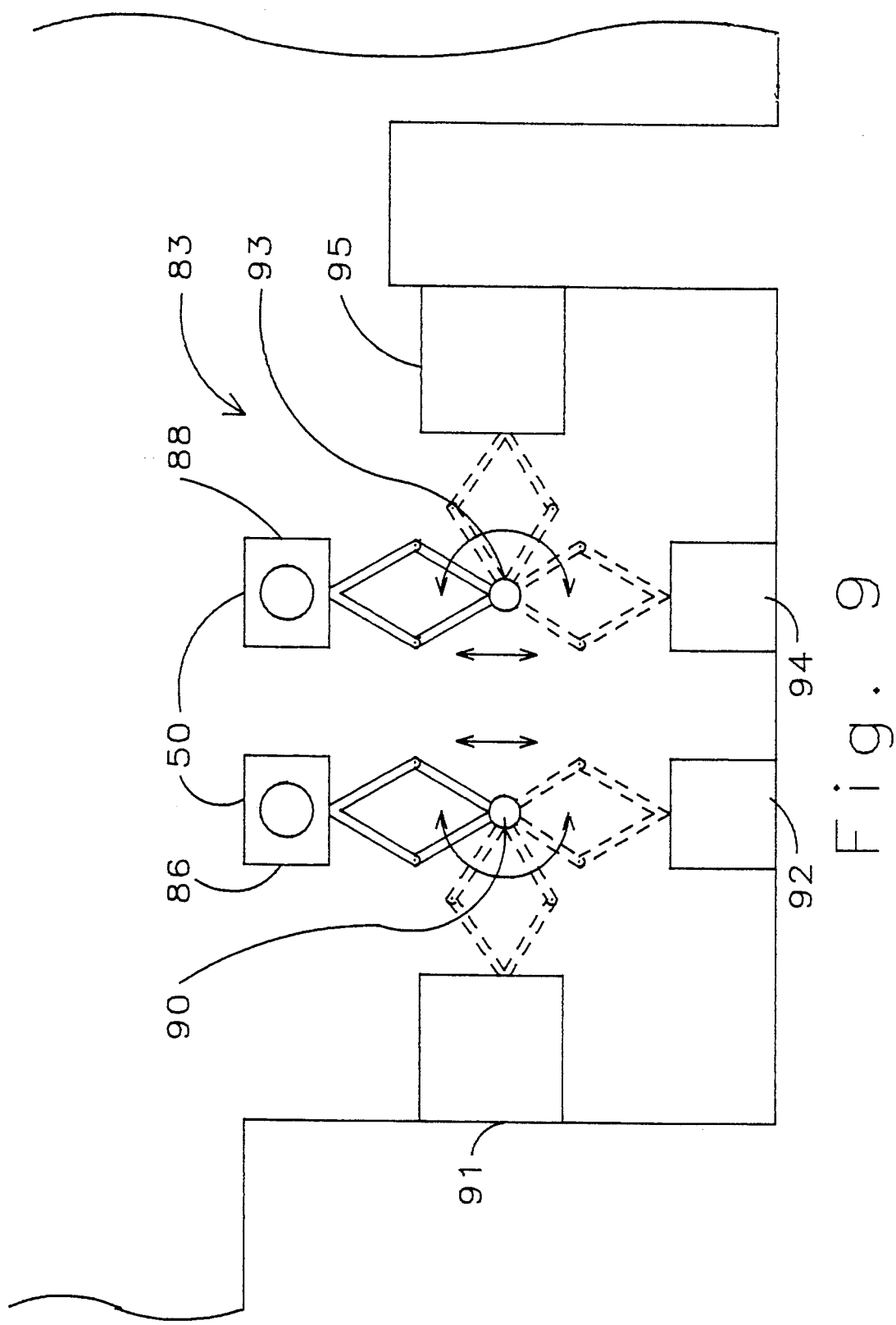
FIG. 9 is a top plan view of the loader and unloader systems.

While at this station or another process station, another wafer carrier and wafer will be loaded on the vehicle. The process sequence of the new wafer carrier will be obtained and the process will repeat itself. If the process sequence is completed on the wafer carrier picked up by the vehicle, the vehicle will pass all the process stations and return to the vehicle station 83. Vehicle station 83 as shown in FIG. 9, has an unload zone 86 and a load zone 88. At the unload zone and the load zone there is provided a vehicle buffer zone where the vehicle can park off the main traffic pattern, in a position to be unloaded or loaded. A suitable handler 90 will unload the wafer carriers to a carrier tray 91 and the wafers to a wafer tray 92. At the load zone 88, there is provided a suitable handler 93 that is capable of loading wafers, from wafer tray 94 onto carriers from carrier tray 95, and the combination onto a vehicle waiting at the load station. Adjacent to the load and unload zones 86 and 88, there is a vehicle parking zone 96 where surplus vehicles can be stored until needed.

At each process station there is provided an interface 97 capable of reading the information storage memory 62 on wafer carriers 54 on wafer carrier buffer 74. Also, an interface 98 is provided to read the memory storage 62 of carriers on carrier buffer 76. Interface 97 determines the process required to be preformed on the wafer, and also any specific process details and the wafer priority. Interface 98 is capable of altering the storage 62 by indicating that the process performed at the process station has been completed.

The handling apparatus 70, 72, 78 and 80 at the processing stations 20, and also at the vehicle stations can be any suitable mechanisms that are provided with suitable gripping means to grip wafers or carriers, depending on the operation required. Typically, the handlers are robots provided with a vacuum gripping means for at least handling the wafer. The slot 60 in the wafer carrier 54 is provided to facilitate handling the wafer. An elongated vacuum tube can be inserted beneath the wafer 56 and the wafer lighted from the tray. The slot may also be used by a suitable gripping element to engage the tray.

Referring now to FIGS. 11A through 11F, a flow diagram is presented to better explain a preferred mode of operation of the manufacturing system of the invention. The start operation, indicated as block 100, occurs at the vehicle station 83. As indicated by block 101, the process sequence for a semiconductor wafer is loaded into the information storage 62 of a wafer carrier 54. At block 102, the semiconductor wafer is loaded on the wafer carrier. At block 103, the wafer carrier is loaded on the carrier vehicle. The necessary process sequence is transferred to the computer on the vehicle. The process sequence determines the first process station as indicated by block 104. The vehicle at block 105 now leaves the vehicle station and begins its trip circuit.

When the vehicle senses the bar code 85 on the tunnel surface, such as the wall, adjacent a tunnel branch with its interface sensor 89 at block 106, a decision is made at block 107. If the bar code indicates that the proper processing station is located on the tunnel branch, the vehicle follows the guide tape into the tunnel branch 24, as in block 109. However, if the branch tunnel 24 does not have the needed processing station, the vehicle continues on down the tunnel, following the guide tape to the next branch, as in block 108.

In the tunnel branch the vehicle reads the first bar code identifying the processing station adjacent thereto at block 110 and a decision is made at block 112. If the processing station is the proper one called for in the process sequence, a second decision is made, that is whether or not the vehicle buffer 64 is full as at block 113. If the vehicle buffer 64 is open, the vehicle moves in as at 114. If the vehicle buffer is occupied, the vehicle moves onto an optional processing station as at block 115. This optional processing station is normally but not necessarily in the same branch tunnel.

Another decision, block 116 is made as to whether or not there is a transport vehicle in the unload station 66. If the unload station is open, the vehicle moves into unload station 66 as indicated by block 117. The wafer carrier 54 is transferred to the carrier buffer 74 at block 118. If the unload station is occupied, the vehicle 50 waits its turn in the vehicle buffer 64.

After the vehicle is unloaded, it moves to the load station 68 as in block 120. At the carrier buffer 74, an interface 97 checks the carrier identification as in block 119. The priority of the wafer is checked at block 121. The highest priority wafer is picked up in the buffer and sent to machine as shown in block 121A. The process sequence of that wafer is loaded from the information storage 62 into the processing apparatus at the processing station at block 122. The wafer is then removed from the carrier and placed in the process apparatus at block 123. Returning to the transport vehicle as it moves from the unload station 66 to the load station 68, at block 120, a decision is made at block 124, that is whether or not there are any wafer carriers in the load buffer 76 as in block 124. If there are wafer carriers, interface 98 checks the priority of the wafer at block 125. The wafer carrier is transferred from the buffer 76 to the vehicle at block 126 and the process sequence in the carrier storage 62 is transferred to the vehicle computer at block 127.

A decision is made at block 128 as to whether or not the process step performed at the processing station was the final step in the process sequence. If the process step was not the final one, the vehicle moves to the next processing station called for in the process sequence, repeating the blocks 106, 107, 108, 109, 110, 111, 112, 113, 114 and 115.

If the process step is the last one called for in the process sequence, the vehicle bypasses all the processing stations and returns to unload zone 86 in the vehicle station 83 as in block 130. The wafer carrier is then transferred from the vehicle to the carrier 91 at block 131 and the finished wafer to wafer 92 at block 132 by handler 90. The vehicle than returns to zone 96 at block 133 and thus ends the process sequence at block 134.

Returning now to decision block 124, when there are no unfinished wafers in the load buffer 76, a check will be made as to whether or not there are other vehicles available to pick up wafers from station at block 135. If there are other vehicles available in the immediate area, the vehicle returns to the vehicle zone 84 at block 136. If there are no vehicles available, the vehicle will remain at the load station 68 as in block 137.

Figure 12:
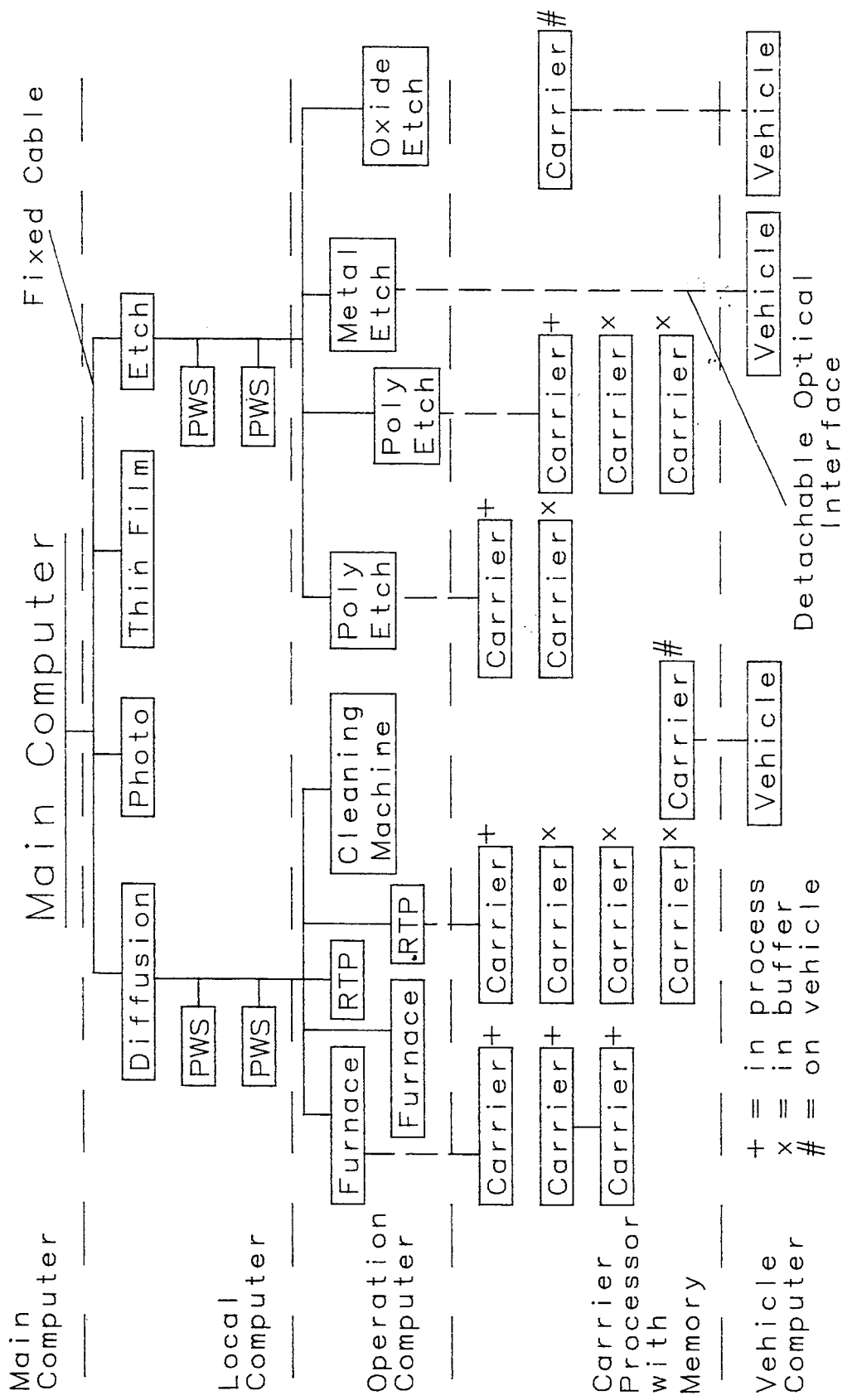
FIG. 12 schematically illustrates the computer arrangement and their connections necessary to operate the present system and method.

Referring now more particularly to FIG. 12, the computer organization of the single wafer manufacturing system and method can be understood. There is one Main Computer for each FAB or manufacturing line. Its functions are (1) auditing the wafer status in the FAB by area work in process (WIP) control and (2) arranging schedules, priority send instructions to local and operation computers. The Local Computer is located in and with each operation area, that is Diffusion, Photo, Thin Film and Etch. It's functions are (1) monitoring status of each operation steps, (2) auditing the wafer status in each operation area by operation WIP control, and (3) statistical analysis of production and quality data. The Personal Workstations (PWS) are equipped with each engineering staff member of each operation area. Its function is the major human interface to all computers, and to work as a stand alone personal computer. The Operation Computer is equipped with each operation step. Its functions are (1) to control each load/unload buffer, robot arm and to manage the inventory wafers in the buffers and (2) record status of each operation process and equipment and store all the detailed parameters. The Carrier Processor is equipped with each wafer carrier. Its functions are to (1) contain process sequence and process status parameter of the specific wafer and (2) be capable of accepting instructions for changes of sequence or recipes. The Vehicle Computer is equipped with each vehicle. Its functions are (1) directing the destination of each vehicle and (2) be capable of accepting instruction of destination from Carrier Processor or Operation Computer. Note that in FIG. 12 the symbols +, × and # refer to the location of the Carrier processor to be in process, in buffer and on vehicle, respectively.

There may be a problem of too many vehicles/wafers in the system. The solution to this problem is to either (1) use a multilayer tunnel, that is more than one tunnel above one another or (2) have multilanes in the single tunnel. With the multilayer tunnel there is a problem with the air flow from top to bottom. Air would have to move horizontally.

The manufacturing system of the invention is adapted to process single wafers (or batch wafers) with single wafer transfer, as contrasted with batch wafer transferring, as is widely practiced by the prior art. Any wafer in the system can advance to the next processing step as shown as it finishes the current step. Unlike batch cassette transfer processing, a wafer having finished its process does not have to wait in a cassette until the whole lot is finished to move to the next processing station for the next process step to begin. This single wafer transfer reduces the inventory of wafers tied up in processing, thereby reducing inventory costs, and storage costs. Smaller numbers of similar type devices can be processed at cost effective rates, and there is a shorter turn-about time which results in a faster response to customer requirements. This also reduces the risks due to production problems and/or market variations. Fast process and product development time is a very important advantage of this new single wafer processing and single wafer transfer system and method.

Figure 7:
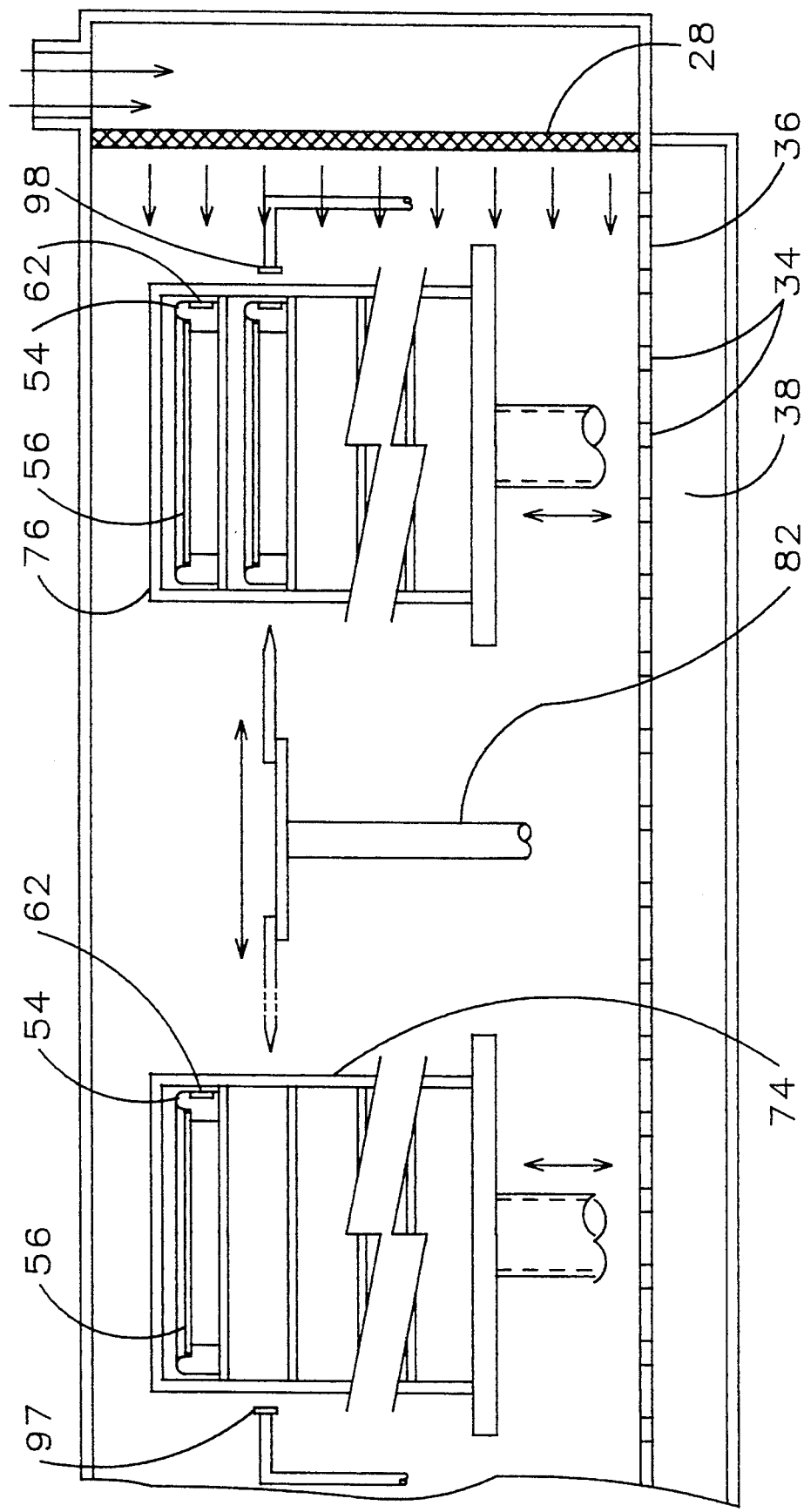
FIG. 7 is an elevational view taken on line 7—7 of FIG. 2 showing the load and unload buffer and laminar air flow systems.
Figure 8:
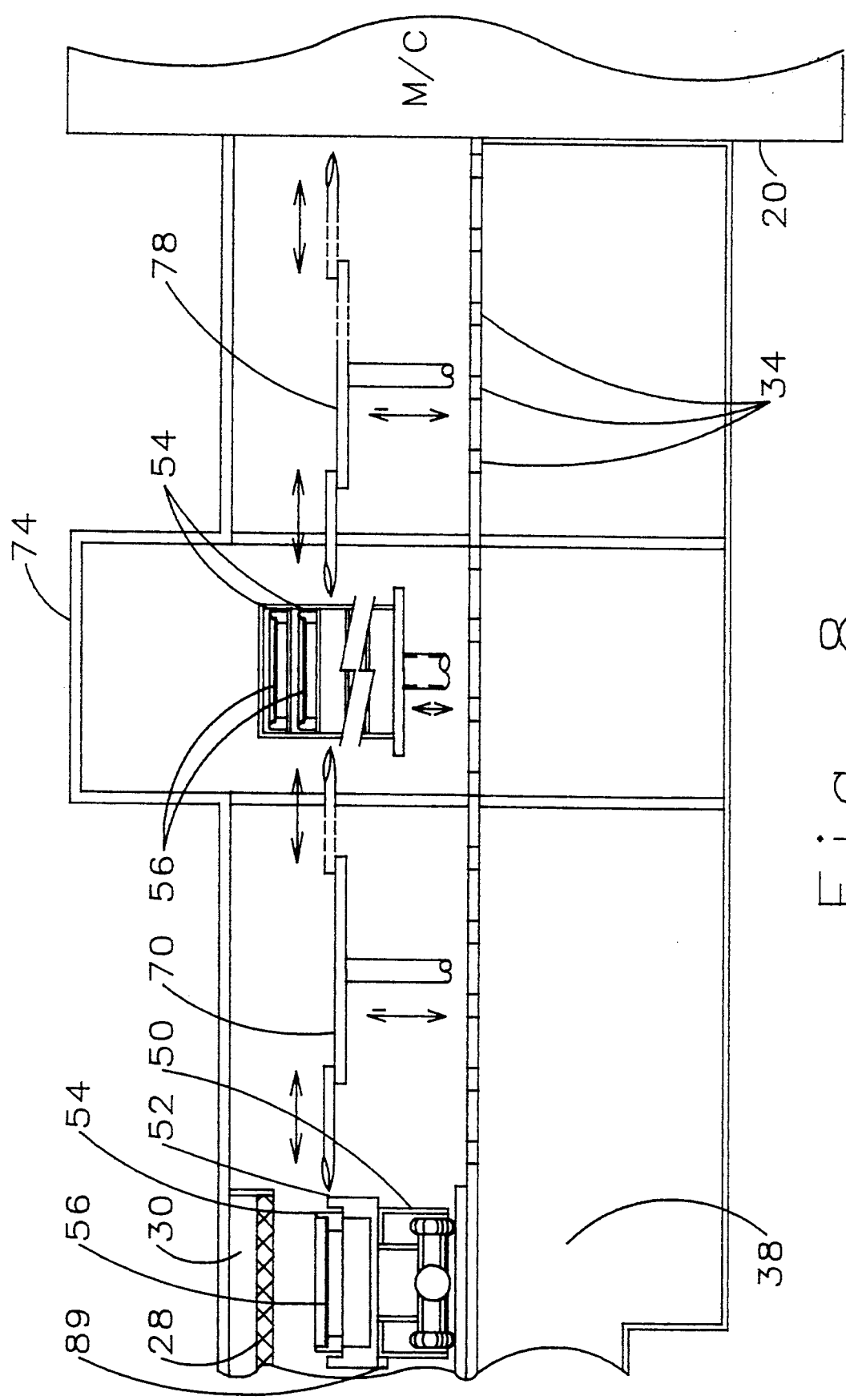
FIG. 8 is a view taken on line 8—8 of FIG. 2 and shows further details of the robot and buffer systems.

The wafer carrier buffer 76 as seen in FIG. 7 is something similar to a wafer cassette, but the wafer carrier can come in from one side and out the other side. The potential drawback of such a structure is that movement of the wafer carrier can cause particles to form by abrasion of the wafer carrier to mechanical parts to form and contaminate the remaining wafers in the wafer buffer. The carrier buffer as illustrated in FIG. 7 has all carriers, each with wafer isolated by the support plate to overcome this potential yield problem. Laminar air flow blows horizontally to keep the wafer on the carrier clean of these particles. Any movement of the wafer carrier may cause particles, but they will not affect the rest of the wafers in the buffer.

Yield improvements are realized because (1) with the carrier there is no movement of abrasion happening above wafers as in the batch type cassette transfer systems, thusly reducing defects, (2) the very short queuing time reduces chance of getting unwanted particles on the wafers, and (3) there is isolation from humans.

Cost improvements are realized because (1) a small clean environment, that is the tunnel areas and (2) simple transfer mechanisms.

The optimum single wafer transfer FAB cycle time was simulated for a 1M SRAM process using 0.8 microns line width, double poly silicon, double metal interconnection and total of 17 layer mask steps. The comparison of cycle time between traditional cassette transfer process and single wafer transfer process is as per the following table:

|  | Ideal Cycle Time | Normal Cycle Time |
| --- | --- | --- |
| Single wafer transfer | 2.5 days | 11.2 days |
| Cassette transfer | 14.1 days | 63.6 days |

The Single Wafer process included all single wafer processing except 12 steps which at this time are still batched. These include 4 high current implant steps, 5 LPCVD steps and 3 furnace steps. These 12 steps take 2.1 days of operation time and consume 88% of ideal cycle time of single wafer transfer process. The Ideal Cycle Time for single wafers (or cassette in Cassette Transfer process) has no delay. When they arrive at each step, they can be put into operation immediately. The Normal Cycle Time is obtained by multiplying Ideal Cycle Time by 4.5. It means after each single wafer ( or cassette ) reaches the process step, it has to wait 3.5 wafers (or cassettes) to finish the operation before it starts the next operation. According to our experience and referring to other FABs this is a reasonable number for Normal Cycle Time. The Transfer Time is assume to be 5 minutes on average. This process contains 137 transfers, so the total transfer time is half a day. This number is negligible unless the cycle time is very short. It is not included in the numbers shown in the table. These simulated results in the Table show the clear advantage of the new system and method of single wafer transfer.

While the invention has been particularly shown and described with reference to a preferred embodiment thereof, it will be understood by those skilled in the art that changes in form and detail may be made therein without departing from the spirit and scope of the invention.

What is claimed is:

1. A manufacturing system for handling and individually processing semiconductor wafers through a plurality of processing stations that perform operations on the wafers in accordance with a wafer process sequence comprising:

a plurality of processing stations, each having a region of a controlled environment, each of said stations being capable of performing at least one processing operation in said region of controlled environment on each of said semiconductor wafers;

a branched tunnel having a top and a bottom connected to each of said regions of said controlled environment of said processing stations;

a means for maintaining a clean air environment in said branched tunnel;

a plurality of wafer carriers each adapted to support a single wafer;

a plurality of guided transport vehicles adapted to operate independently in said branched tunnel and move to any of said processing stations associated with said branched tunnel;

said transport vehicles adapted to convey at least a single wafer carrier between any of said processing stations;

each of said processing stations being provided with (1) a transport vehicle buffer having an unload zone and a load zone, (2) a wafer carrier buffer, (3) a wafer carrier handling means adapted to transfer wafer carriers between a transport vehicle at said transport vehicle buffer and said wafer carrier buffer, and (4) a wafer handling means to move wafers between the wafer carriers in said wafer carrier buffer and a wafer processing apparatus at said processing station;

a memory storage means on each of said wafer carriers capable of holding the desired wafer process sequence for the wafer associated with the said wafer carrier;

a means for directing said guided transport vehicles to move wafer carriers sequentially to each processing station in accordance with the wafer process sequence stored in each of said memory storage means on said wafer carriers; and a vehicle station having a wafer carrier loading area where wafers are introduced into the system and a wafer carrier unload area where processed wafers are removed from the system.

2. The manufacturing system of claim 1 wherein said means for maintaining a clean air environment in the said tunnel includes a means to direct clean filtered air to the top of the tunnel and a means to withdraw air from the bottom of the tunnel to make the tunnel environment at least a Class 10.

3. The manufacturing system of claim 2 wherein said means to direct clean air to the top of the tunnel includes an air supply duct in the top of the tunnel and an air filter, said means to withdraw air includes a perforated tunnel floor with an underlying exhaust air duct, and a blower to circulate air.

4. The manufacturing system of claim 3 wherein said air filter is capable of removing particles greater than about 0.10 microns in size.

5. The manufacturing system of claim 1 wherein said branched tunnel has a width that is greater than two times the width of each said guide transport vehicle thereby making possible two-way vehicle traffic.

6. The manufacturing system of claim 5 wherein guiding tape is provided on said bottom of said branched tunnel to maintain orderly lines of vehicle traffic.

7. The manufacturing system of claim 1 wherein each of said guided transport vehicles is provided with a platform for receiving and holding during transport a single wafer carrier and its associated semiconductor wafer.

8. The manufacturing system of claim 6 wherein each of said transport vehicle buffers includes a chamber adjacent to and accessible to said tunnel capable of simultaneously storing at least two transport vehicles.

9. The manufacturing system of claim 8 wherein guide tape is provided in each of said vehicle buffers, said guide tap including a branch off the guide tape in said tunnel to each of said vehicle unload zones and said vehicle load zones.

10. The manufacturing system of claim 9 wherein said wafer carrier buffer is located adjacent to and accessible to said vehicle buffer.

11. The manufacturing system of claim 10 wherein said carrier buffer includes at least one vertically movable stage provided with a plurality of platforms to receive and temporarily store a plurality of wafer carriers.

12. The manufacturing system of claim 11 wherein said wafer carrier handling means includes a first movable arm provided with a means to grip a wafer carrier and transfer it from a transport vehicle at the unload zone to said carrier buffer and a second movable arm provided with a means to grip a wafer carrier and transfer it from said carrier buffer to a transport vehicle.

13. The manufacturing system of claim 12 wherein said wafer carrier buffer includes a first storage means to store wafer carriers received from a transport vehicle at the said unload zone, and a second storage means to store wafer carriers received from the first storage means prior to loading onto a transport vehicle at the said load zone.

14. The manufacturing system of claim 13 wherein said wafer carrier buffer further includes a robot to transfer empty wafer carriers from said first storage means to said second storage means.

15. The manufacturing system of claim 14 wherein said first and said second means to store wafer carriers is each a vertically movable stage provided with a plurality of platforms to receive and temporarily store a plurality of wafer carriers.

16. The manufacturing system of claim 13 wherein said wafer handling means includes a first movable arm provided with a means to grip a wafer and transport it from said first storage means to the associated processing station and a second movable arm provided with a means to grip a wafer and transport it from the processing station to said second storage means.

17. The manufacturing system of claim 1 wherein said vehicle station further includes a first handling means to load an unprocessed wafer onto a wafer carrier and load the wafer carrier onto a transport vehicle, and a second handling means to remove wafer carriers holding processed wafers from transport vehicles, and subsequently remove the processed wafer from the wafer carrier.

18. The manufacturing system of claim 6 wherein said means for directing guided transport vehicles includes an interface to read said memory storage on a wafer carrier, distinct identifying machine readable indicia on said tunnel that identifies the locations of processing stations, an interface on said transport vehicle to read said identifying indicia, a computer means to (1) determine from said process sequence information in said memory storage on said wafer carrier the required next process step, and (2) means to direct the transport vehicle to the required processing station capable of performing the required process step in response to the said identifying indicia on said tunnel.

19. The manufacturing system of claim 18 wherein said identifying machine readable indicia is a bar code.

20. The manufacturing system of claim 19 wherein said identifying machine readable indicia includes a bar code adjacent to each branch of said branched tunnel that indicates the processing stations associated with each branch of the tunnel, and bar code within each branch adjacent each process station to indicate the specific processing station.

21. The manufacturing system of claim 20 wherein said computer means includes a means to direct the transport vehicle to follow said guiding tape in said tunnel that leads into a branch of the tunnel when the processing station is located off a branch of said tunnel.

22. The manufacturing system of claim 21 wherein each processing station has a branched guide tape that leads from the said guiding tape in the tunnel to the vehicle buffer station associated with the processing station.

23. The manufacturing system of claim 22 wherein said computer means has means to direct the transport vehicle to follow the guiding tape that leads to a buffer station associated with the processing station called for by the process sequence in said memory storage of said wafer carrier.

24. The manufacturing system of claim 23 wherein said computer means has means to direct said transport vehicle to said vehicle station upon completion of the process steps in said process sequence in said memory storage of said wafer carrier.

25. A method of manufacturing semiconductor devices in a production line having (a) a plurality of semiconductor wafer processing stations, (b) a tunnel associated with the processing stations, (c) a guided transport vehicle adapted to operate in the tunnel, (d) a plurality of wafer carriers each provided with a memory to accept a wafer process step sequence, (e) a means to maintain a clean environment in the tunnel, (f) handling means at each processing station to transfer a wafer carrier between a transport vehicle and the processing station, and (g) computer means, including interfaces to guide the transport vehicle in the tunnel, load and unload wafer carriers at the various processing stations, in response to instructions from the memories on the wafer carriers, and (h) a vehicle station the method comprised of the following steps:

loading a process sequence into the wafer carrier memory and a wafer onto the wafer carrier;
loading the said wafer carrier onto a transport vehicle; moving the said transport vehicle to a processing station in response to the information contained in the process sequence stored in the wafer carrier memory;
unloading the wafer carrier at the designated processing station;
performing the designated process at the said processing station;
altering the process sequence of the wafer carrier to indicate the process step performed at the said processing station has been completed;
loading the wafer carrier onto a transport vehicle; moving the said transport vehicle to the next processing station in response to the said altered process sequence in the said wafer carrier; and
repeating the method steps contained in the process sequence until the process sequence steps in the said wafer carrier are completed.

26. The method of manufacturing semiconductor devices of claim 25 wherein a single wafer carrier is transported to each processing station and individually processed.

27. The method of manufacturing semiconductor devices of claim 26 wherein each of said process stations has a vehicle buffer zone with a transport vehicle unloading zone and a load zone, and wherein said transport vehicle is moved into the unloading zone at a process station, the wafer carrier unloaded, and the transport vehicle directed to a vacant load zone of a vehicle buffer zone of a process station.

28. The method of manufacturing semiconductor devices of claim 27 wherein the transport vehicle will transport the wafer carrier to a vehicle station upon completion of all the process steps in the process sequence for removal from the production line.

29. The method of manufacturing semiconductor devices of claim 27 wherein the wafer carriers at the vehicle buffer zone are transferred to and from a wafer buffer zone, and the wafer is removed from said wafer carrier for processing and returned to the same wafer carrier upon completion of processing at the wafer buffer zone.

30. The method of manufacturing semiconductor devices of claim 29 wherein said process sequence includes a priority indication for the wafer on said carrier, said wafer buffer zone has the capability of storing a plurality of wafer carriers, and wherein the said priority indication of the wafer on each wafer carrier is checked, and the wafer with the highest priority is selected for processing.

31. The method of manufacturing semiconductor devices of claim 30 therein the processing sequence of the wafer selected on the basis of priority is loaded into the processing station capable of performing the process step called for in the process sequence and the process step called for is performed on the wafer.

32. The method of manufacturing semiconductor devices of claim 26 wherein the tunnel has a plurality of branches with a plurality of processing stations located on each branch, wherein said guided transport vehicle locates the process station capable of providing the process step called for in the process sequence by reading indicia adjacent each branch that lists the various process stations on each branch, and upon entering the branch locates the specific processing station by reading indicia adjacent each processing station within the branch.

33. A manufacturing system for individually handling and processing semiconductor wafers through a plurality of processing stations that perform operations on the wafers in accordance with a wafer process sequence comprising:

a plurality of processing stations, each of said stations being capable of performing at least one processing operation on each of said wafers;
a branched track providing a support surface leading to each of said processing stations;
a plurality of wafer carriers, each adapted to support a single wafer;
a plurality of guided transport vehicles adapted to operate on said branched track and move to any of said processing stations associated with said branched track, said transport vehicles adapted to convey at least a single wafer carrier between any of said processing stations;
each of said processing stations being provided with (1) a transport vehicle buffer having an unload zone, and a load zone, (2) a wafer carrier buffer, (3) a wafer carrier handling means adapted to transfer at least a single wafer carrier between a transport vehicle and said wafer carrier buffer, (4) a wafer handling means to move wafers between the wafer carriers and a wafer processing apparatus at each of said processing stations;
a memory storage means on each of said wafer carriers capable of holding the wafer process sequence for the wafer associated with the supporting wafer carrier;
a means for directing said transport vehicles to move wafer carriers sequentially to each processing station in accordance with the wafer processing sequence;
a vehicle station having a wafer carrier loading area where wafers are introduced into the system, and a wafer carrier unload area where processed wafers are removed from the system.

34. The manufacturing system of claim 33, wherein said means for directing said transport vehicles is comprised of a (1) tape provided on said branched track, (2) an interface on each of said transport vehicles to read said memory storage means on said wafer carriers, (3) machine readable indices adjacent said branched track that identify the locations of processing stations, (4) a computer means to determine the process sequence in said memory storage means, and (5) a means to direct each of said transport vehicles to the process station capable of performing the process step called for in the process sequence.

35. The manufacturing system of claim 34 wherein said computer means has means to direct each of said transport vehicles to said vehicle station upon completion of the process steps in said process sequence in said memory storage of said wafer carrier.

* * * * *